United States Patent
Lin et al.

(10) Patent No.: US 10,395,590 B1
(45) Date of Patent: Aug. 27, 2019

(54) HYBRID MICRODRIVER ARCHITECTURE FOR DRIVING MICROLED DISPLAYS

(71) Applicant: Apple Inc., Cupertino, CA (US)

(72) Inventors: Chin Wei Lin, Cupertino, CA (US); Shinya Ono, Cupertino, CA (US); Vasudha Gupta, Cupertino, CA (US); Mohammad B. Vahid Far, San Jose, CA (US)

(73) Assignee: Apple Inc., Cupertino, CA (US)

( * ) Notice: Subject to any disclaimer, the term of this patent is extended or adjusted under 35 U.S.C. 154(b) by 263 days.

(21) Appl. No.: 15/247,698

(22) Filed: Aug. 25, 2016

Related U.S. Application Data

(60) Provisional application No. 62/220,843, filed on Sep. 18, 2015.

(51) Int. Cl.
*G09G 3/3233* (2016.01)
*G09G 3/3275* (2016.01)

(52) U.S. Cl.
CPC ......... *G09G 3/3233* (2013.01); *G09G 3/3275* (2013.01); *G09G 2310/027* (2013.01); *G09G 2310/0294* (2013.01)

(58) Field of Classification Search
CPC ... G09G 3/3233; G09G 3/2014; G09G 3/3275
See application file for complete search history.

(56) References Cited

U.S. PATENT DOCUMENTS

| | | | |
|---|---|---|---|
| 2005/0067968 A1* | 3/2005 | Yamashita | G09G 3/3258 315/167 |
| 2006/0007249 A1* | 1/2006 | Reddy | G06F 3/03542 345/690 |
| 2006/0050031 A1* | 3/2006 | Suzuki | G09G 3/3275 345/77 |
| 2008/0055289 A1 | 3/2008 | Kim | |
| 2008/0224975 A1* | 9/2008 | Lee | G09G 3/3648 345/89 |
| 2009/0167649 A1* | 7/2009 | Ishizuka | G09G 3/3258 345/80 |
| 2010/0045650 A1 | 2/2010 | Fish | |
| 2011/0025671 A1 | 2/2011 | Lee | |
| 2012/0105498 A1 | 5/2012 | Kim | |

(Continued)

*Primary Examiner* — Abbas I Abdulselam
(74) *Attorney, Agent, or Firm* — Jaffery Watson Mendonsa & Hamilton LLP

(57) ABSTRACT

Methods, systems, and apparatuses for controlling an emission of the light emitting devices are described herein. The light emitting devices may be light emitting diode (LED) devices including µLED devices or organic LED (OLED) devices. Emission control of the LED may be performed using a micro-scale driving circuit (e.g., µDriver) containing drive transistors for constant current driving of the light emitting devices. One embodiment provides for a display driver hardware circuit comprising a thin film transistor (TFT) backplane, an integrated circuit including emission logic to cause an LED emission pulse, and a ramp signal generator to cause a voltage ramp having a slope based on an analog input voltage from the TFT backplane. The length of the LED emission pulse is related to the slope of the voltage ramp. In one embodiment the TFT backplane includes a low temperature poly-silicon (LTPS) transistor and/or an Indium Gallium Zinc Oxide (IGZO) transistor.

24 Claims, 18 Drawing Sheets

Hybrid Micro-driver Display Architecture - 100

(56) References Cited

U.S. PATENT DOCUMENTS

| | | |
|---|---|---|
| 2013/0241438 A1 | 9/2013 | Suzuki |
| 2013/0319992 A1 | 12/2013 | Meusburger |
| 2014/0168037 A1* | 6/2014 | Sakariya ............... G09G 3/3233 345/82 |
| 2014/0346473 A1 | 11/2014 | Park |
| 2016/0163265 A1* | 6/2016 | Yang .................... G09G 3/3233 345/690 |
| 2016/0181346 A1* | 6/2016 | Kwon ................. H01L 27/3276 257/40 |
| 2018/0211940 A1* | 7/2018 | Henry .................. H01L 27/156 |

* cited by examiner

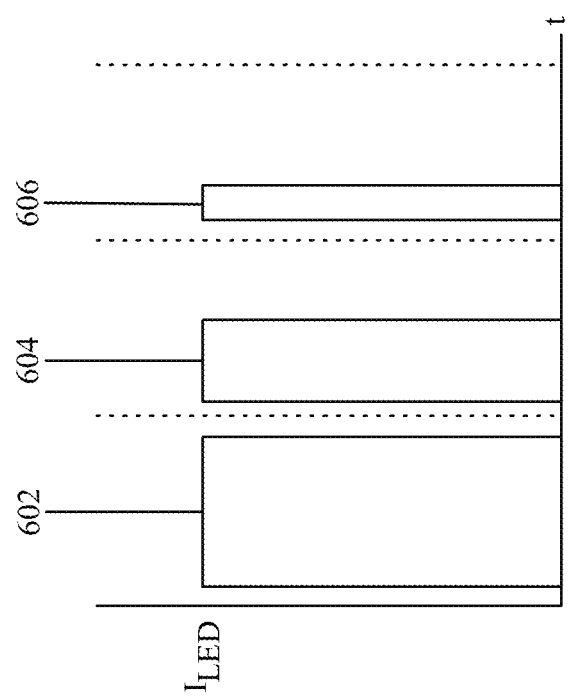
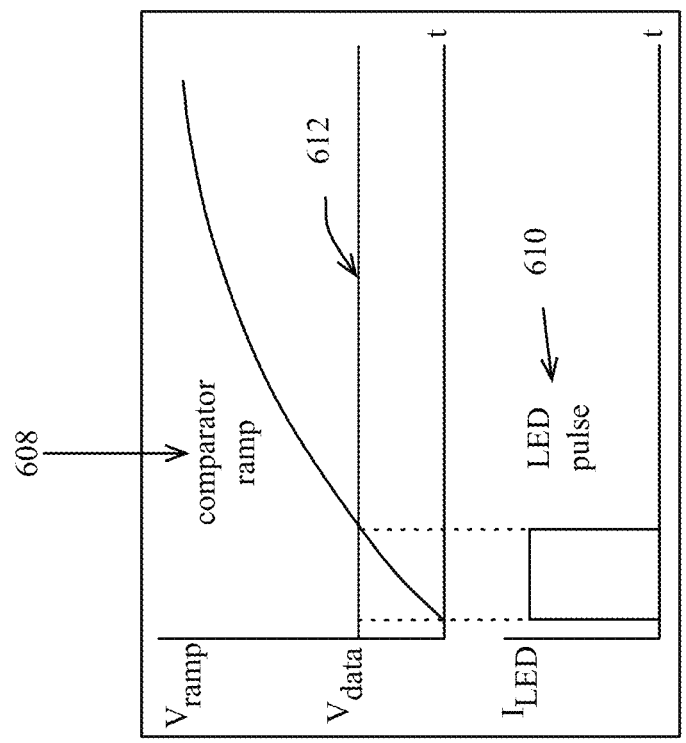
FIG. 6A
FIG. 6B

HYBRID MICRODRIVER ARCHITECTURE FOR DRIVING MICROLED DISPLAYS

CROSS-REFERENCE

The present application is a non-provisional application claiming the benefit of U.S. Provisional Application No. 62/220,843 filed on Sep. 18, 2015, which is hereby incorporated herein by reference.

FIELD

The disclosure relates generally to a display system, and, more specifically, to display driving circuitry for LED displays.

BACKGROUND OF THE DISCLOSURE

Display panels are utilized in a wide range of electronic devices. Common types of display panels include active matrix display panels where each pixel may be driven to display a data frame. High-resolution color display panels, such as computer displays, smart phones, and televisions, may use an active matrix display structure. An active matrix display of m×n display (e.g., pixel) elements may be addressed with m row lines and n column lines or a subset thereof. In conventional active matrix display technologies a switching device and storage device is located at every display element of the display. A display element may be a light emitting diode (LED) or other light emitting material. A storage device(s) (e.g., a capacitor or a data register) may be connected to each display (e.g., pixel) element, for example, to load a data signal therein (e.g., corresponding to the emission to be emitted from that display element). The switches in conventional displays are usually implemented through transistors made of deposited thin films, and thus are called thin film transistors (TFTs). A common semiconductor used for TFT integration is amorphous silicon (a-Si), which allows for large-area fabrication in a low temperature process. A main difference between a-Si TFT and a conventional silicon metal-oxide-semiconductor-field-effect-transistor (MOSFET) is lower electron mobility in a-Si due to the presence of electron traps. Another difference includes a larger threshold voltage shift. Low temperature polysilicon (LTPS) represents an alternative material that is used for TFT integration. LTPS TFTs have a higher mobility that a-Si TFTs, yet mobility is still lower than for MOSFETs.

SUMMARY OF THE DESCRIPTION

Methods, systems, and apparatuses for controlling an emission of the light emitting devices are described herein. The light emitting devices may be light emitting diode (LED) devices including μLED devices or organic LED (OLED) devices. Emission control of the LED may be performed using a micro-scale driving circuit (e.g., μDriver) containing drive transistors for constant current driving of the light emitting devices.

One embodiment provides for a display driver hardware circuit comprising a thin film transistor (TFT) backplane, an integrated circuit including emission logic to cause an LED emission pulse, and a ramp signal generator to cause a voltage ramp having a slope based on an analog input voltage from the TFT backplane. The length of the LED emission pulse is related to the slope of the voltage ramp. In one embodiment the TFT backplane includes a low temperature poly-silicon (LTPS) transistor. In one embodiment the TFT backplane additionally includes an Indium Gallium Zinc Oxide (IGZO) transistor. In one embodiment the integrated circuit is comprised of crystalline silicon. In one embodiment the integrated circuit has a maximum lateral dimension of 1 to 100 μm.

In one embodiment the integrated circuit includes comparator logic to trigger the emission logic to supply a drive current to an LED during the LED emission pulse. In one embodiment, the drive current is a constant current based on an adjustable reference voltage. The emission pulse can be adjusted from a continuous duty cycle to a non-continuous duty cycle. In one embodiment the emission logic is to terminate current to the LED to end the emission pulse based on output of the comparator logic. The comparator logic includes a transistor having a voltage source coupled to a substrate terminal, where the voltage source is to modify a voltage threshold of the transistor. In one embodiment the voltage source is to increase the voltage threshold of the transistor.

One embodiment provides for a display driver hardware circuit comprising a thin film transistor (TFT) backplane and an integrated circuit including emission logic to cause an LED emission pulse, the emission pulse adjustable from a continuous duty cycle to a non-continuous duty cycle, where the integrated circuit is a crystalline silicon integrated circuit including a ramp signal generator to cause a voltage ramp having a slope based on an analog input voltage from the TFT backplane, wherein a length of the LED emission pulse is related to the slope of the voltage ramp. In one embodiment the integrated circuit additionally includes comparator logic to trigger the emission logic to supply a drive current to an LED during the LED emission pulse. In one embodiment the comparator logic includes a transistor having a voltage source coupled to a substrate terminal, the voltage source to modify a voltage threshold of the transistor, where the voltage source is to increase the voltage threshold of the transistor.

In one embodiment a light emitting assembly comprises an array of light emitting diode (LED) devices, a ramp signal generator including a first thin film transistor (TFT), a sample and hold circuit including a second TFT, and an array of microcontrollers to switch and drive the array of LED devices based on a voltage ramp caused by the ramp signal generator, where the voltage ramp is to determine a pulse length of an emission pulse to an LED device of the array of LED devices. In one embodiment the number of microcontrollers in the array of microcontrollers is less than the number of LED devices in the array of LED devices. Each microcontroller in the array of microcontrollers is in electrical connection with a plurality of pixels to drive a plurality of LED devices in each pixel.

One embodiment provides for the light emitting assembly described above, where each LED device in the array of LED devices has a maximum lateral dimension of 1 to 100 μm, and/or where at least one microcontroller in the array of microcontrollers has maximum lateral dimension of 1 to 100 μm. One embodiment provides for a light emitting assembly comprising a voltage compensation transistor coupled to the ramp signal generator and the sample and hold circuit, the voltage compensation transistor to cause a change in a voltage threshold of the first TFT of the ramp signal generator. The assembly can include TFT devices comprised of low temperature poly-silicon (LTPS) transistor and/or Indium Gallium Zinc Oxide (IGZO).

One embodiment provides for a display system comprising a backplane including an active area, an array of micro driver chips in the active area, an array of micro light emitting diode (LED) devices in the active area, where the array of micro LED devices is electrically connected to the array of micro driver chips, and each micro driver chip controls a plurality of pixels and an emission controller to cause the array of micro driver chips to supply an emission pulse to the array of LED devices, where the emission pulse is a function of an analog input data voltage. In one embodiment the display system additionally comprising a row of column drivers including a plurality of column drivers and a column of row drivers including a plurality of row drivers. In one embodiment the length of the emission pulse is inversely related to the analog input voltage. In one embodiment the backplane is a TFT backplane and the array of micro driver chips comprises an array of crystalline silicon integrated circuits to switch and drive the array of micro LED devices. In one embodiment the backplane includes a low temperature poly-silicon (LTPS) transistor. In one embodiment the backplane includes an Indium Gallium Zinc Oxide (IGZO) transistor.

BRIEF DESCRIPTION OF THE DRAWINGS

Embodiments are illustrated by way of example and not limitation in the Figures of the accompanying drawings:

FIG. 6A is an illustration of pulse width modulation (PWM) in accordance with an embodiment.

FIG. 6B is an illustration of PWM determination in a µDriver based on a voltage ramp and an input data voltage, according to embodiments.

DETAILED DESCRIPTION

Figure 1:
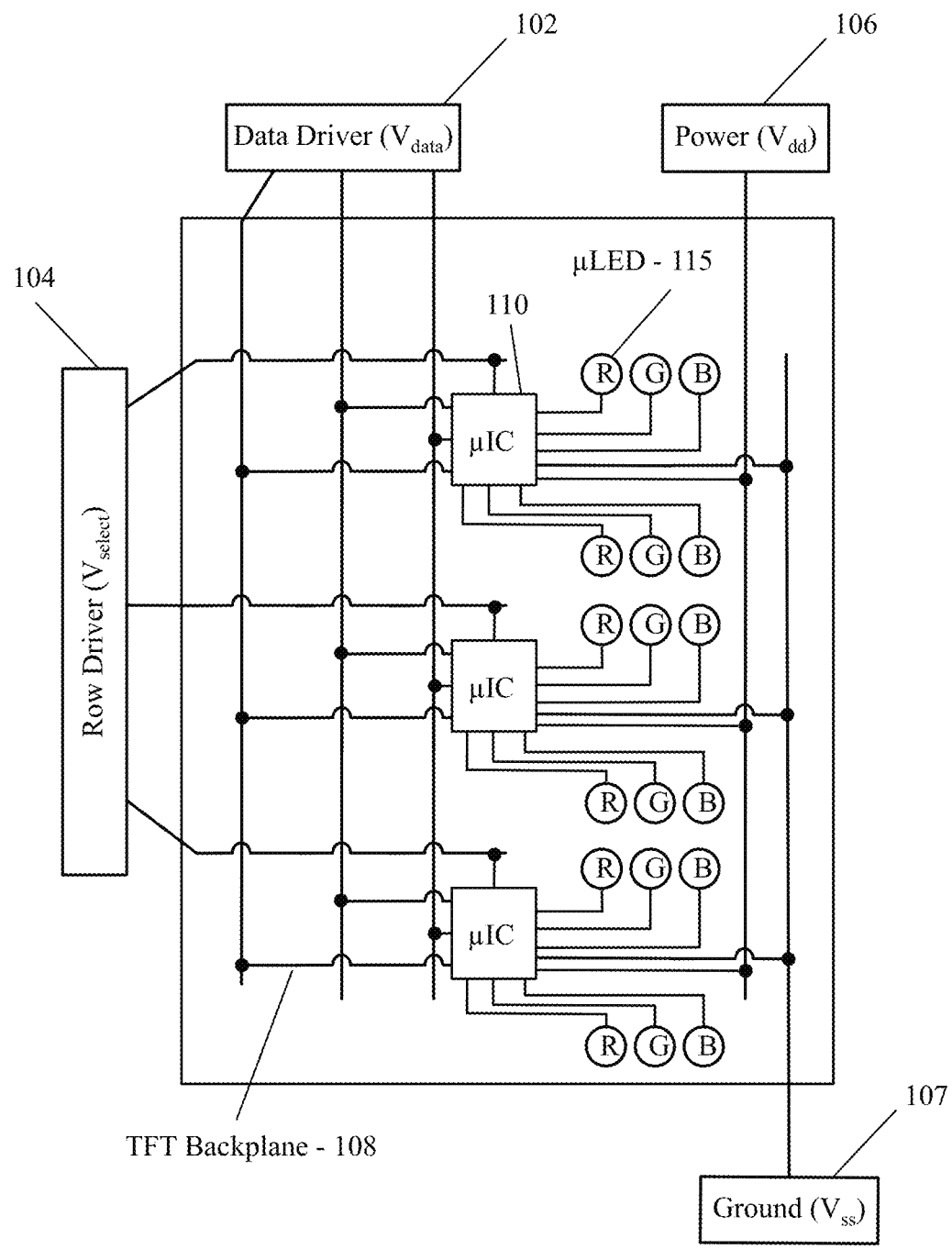
FIG. 1 is a block diagram of hybrid micro-driver display architecture, according to an embodiment.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the present disclosure. In other instances, well-known techniques and components have not been described in particular detail in order to not unnecessarily obscure the present disclosure. Additionally, concepts described in detail in some figures are not described in detail in other figures. For the sake of brevity of description, the description of identical features that are identified by identical numerals may not be repeated throughout the description.

Reference throughout this specification to "one embodiment," "an embodiment", or the like means that a particular feature, structure, configuration, or characteristic described in connection with the embodiment is included in at least one embodiment of the disclosure. Thus, the appearances of the phrase "in one embodiment," "in an embodiment", or the like in various places throughout this specification are not necessarily referring to the same embodiment of the disclosure. Furthermore, the particular features, structures, configurations, or characteristics may be combined in any suitable manner in one or more embodiments.

The terms "over," "to," "between," and "on" as used herein may refer to a relative position of one layer with respect to other layers. One layer "over," or "on" another layer or bonded "to" another layer may be directly in contact with the other layer or may have one or more intervening layers. One layer "between" layers may be directly in contact with the layers or may have one or more intervening layers.

The term "ON" as used in this specification in connection with a device state refers to an activated state of the device, and the term "OFF" refers to a de-activated state of the device. The term "ON" as used herein in connection with a signal received by a device refers to a signal that activates the device, and the term "OFF" used in this connection refers to a signal that de-activates the device. A device may be activated by a high voltage or a low voltage, depending on the underlying electronics implementing the device. For example, a PMOS transistor device is activated by a low voltage while a NMOS transistor device is activated by a high voltage. Thus, it should be understood that an "ON" voltage for a PMOS transistor device and a NMOS transistor device correspond to opposite (low vs. high) voltage levels. It is also to be understood that where Vdd and Vss is illustrated or described, it can also indicate one or more Vdd and/or Vss. For example, a digital Vdd for can be used for data input, digital logic, memory devices, etc., while another Vdd is used for driving the LED output block.

In accordance with some embodiments, a hybrid LED driving circuit is described which is a hybrid arrangement of microdriver (also referred to as µD or µDriver) chips and a TFT substrate which, in combination, are used to driver a set of light emitting devices such as, but not limited to micro LEDs (also referred to as µLEDs). In an embodiment, a micro LED may be a semiconductor-based material having a maximum lateral dimension of 1 to 300 µm, 1 to 100 µm, 1 to 20 µm, or more specifically 1 to 10 µm, such as 5 µm. The light emitting devices may also be organic LEDs (OLEDs).

The hybrid LED driving circuit can use a hybrid of analog and digital driving techniques, in which an analog input voltage is used to control a digital pulse-width-modulation (PWM) driving scheme and may include a set of microdriver (e.g., µDriver) chips, which are integrated circuits containing emission logic to drive the LED devices. A µDriver chip may have a maximum lateral dimension of 1 to 100 µm, and may fit within the pixel layout of the micro LEDs. In accordance with embodiments, the µDriver chips can replace the LED drive transistors for each display element, which are commonly employed as TFT components. The µDriver chips may include digital unit cells, analog unit cells, or hybrid digital and analog unit cells. Additionally, MOSFET processing techniques may be used for fabrication of the µDriver chips on single crystalline silicon, in conjunction with TFT processing techniques on a-Si or LTPS.

The hybrid TFT and µDriver circuit can realize the benefits of µDriver circuit technology while reducing the overall size and number of inputs for each µDriver integrated circuit. The hybrid circuit includes a portion of the transistors and capacitors in a TFT layer while including an additional portion of LED switching and driving components in the µDriver integrated circuit, resulting in a reduced size and manufacturing cost of each µDriver circuit relative to including all switching and driving components in the µDriver. This hybrid approach combines traditional analog data driving with digital, constant current emission pulse width modulation (PWM), where the length of the emission pulse is a function of analog data voltage. The use of analog data driving allows the use of traditional SCAN and DATA lines coupled to a TFT substrate, where switching transistors and capacitors on the TFT substrate provide an analog input voltage to the µDriver circuit.

Hybrid TFT Micro-Driver Integrated Circuit Display Architecture and Overview

FIG. 1 is a block diagram of a hybrid micro-driver display architecture 100, according to an embodiment. In one embodiment, the hybrid µDriver display architecture 100 includes a data driver (Vdata) 102, a row driver (Vselect) 104 inputs to control the display, as well as power (Vdd) 106, and ground (Vss) inputs 107. A µDriver integrated circuit (IC) 110 and one or more µLEDs 115 are placed on a TFT backplane 108 including switching transistors and capacitors to supply data to the µDriver IC 110.

The µDriver IC 110 includes drive transistors for the one or more µLEDs 115 and can be fabricated separately from the TFT backplane 108 in a crystalline silicon wafer. The µDriver IC 110 can be placed directly onto any active or passive TFT backplane and can interface with any type of LED, including organic LEDs (OLED). The µDriver IC 110 can include a combination of any of the available CMOS types required for implementing the driver (such as CMOS, all NMOS or all PMOS).

In this figure, and in the figures to follow, each illustrated LED device (e.g., µLED 115) may represent a single LED device, or may represent multiple LED devices arranged in series, in parallel, or a combination of series and parallel. The LED devices can couple to a common ground or may each have a separate ground connection. The exemplary hybrid microdriver display architecture 100 illustrated shows three control inputs and six LED outputs, but embodiments are not so limited. A single µDriver IC 110 can control multiple lighting emitting devices, where each lighting devices has a separate analog input into the µDriver IC 110.

In one embodiment, the µDriver IC 110 couples with one or more red, green, and blue LED devices (e.g., µLEDs 115) that emit different colors of light. In a red-green-blue (RGB) sub-pixel arrangement, each pixel includes three sub-pixels that emit red, green and blue lights, respectively. The RGB arrangement is exemplary and that embodiments are not so limited. Additional sub-pixel arrangements include, red-green-blue-yellow (RGBY), red-green-blue-yellow-cyan (RGBYC), or red-green-blue-white (RGBW), or other sub-pixel matrix schemes where the pixels may have a different number of sub-pixels, such as the displays manufactured under the trademark name PenTile®.

In one embodiment, the smart-pixel micro-matrix is used in LED lighting solutions, or as an LED backlight for an LCD device. When used as a light source, blue or UV LEDs in combination with a yellow or blue-yellow phosphor may be used to provide a white backlight for LCD displays. In one embodiment, a smart-pixel micro-matrix using one or more blue LED devices, such as an indium gallium nitride (InGaN) LED device, is combined with the yellow luminescence from cerium doped yttrium aluminum garnet (YAG:Ce3+) phosphor. In one embodiment, red, green, and blue phosphors are combined with a near-ultraviolet/ultraviolet (nUV/UV) InGaN LED device to produce white light. The phosphor can be bonded to the surface of the LED device, or a remote phosphor can be used. In addition to white light emission, additional red, green and/or blue LED device can also be used to provide a wider color gamut than otherwise possible with white backlights.

In one embodiment, each sub-pixel circuit driver in the µDriver IC 110 is responsible for providing operating current for illumination to each individual LED. Thus, the circuitry for each sub-pixel circuit can be designed specifically for each LED, allowing the switching transistors in the backplane to be implemented by any combination of LTPS (Low Temperature Poly Silicon) and/or Oxide (e.g., IGZO or Indium Gallium Zinc Oxide) TFTs to ensure low leakage devices, while the technology of the µDriver IC 110 is independent of the backplane. The independent backplane and µDriver IC 110 enable the production of low voltage devices having higher mobilities. The higher mobilities of the driving circuit devices provide higher currents to the LEDs, resulting in reduced maximum rail voltages for reduced power consumption while maintaining minimum geometry transistors. The smaller geometry transistors enable the circuit to operate at higher speeds with lower parasitic losses, as the circuit occupies a smaller area. The size of the µDriver IC 110, in one embodiment is 50 µm wide by 24 µm long. However, the size of each µDriver IC 110 generally depends on the number of sub-pixel circuit drivers the µDriver IC 110 contains.

Figure 2A:
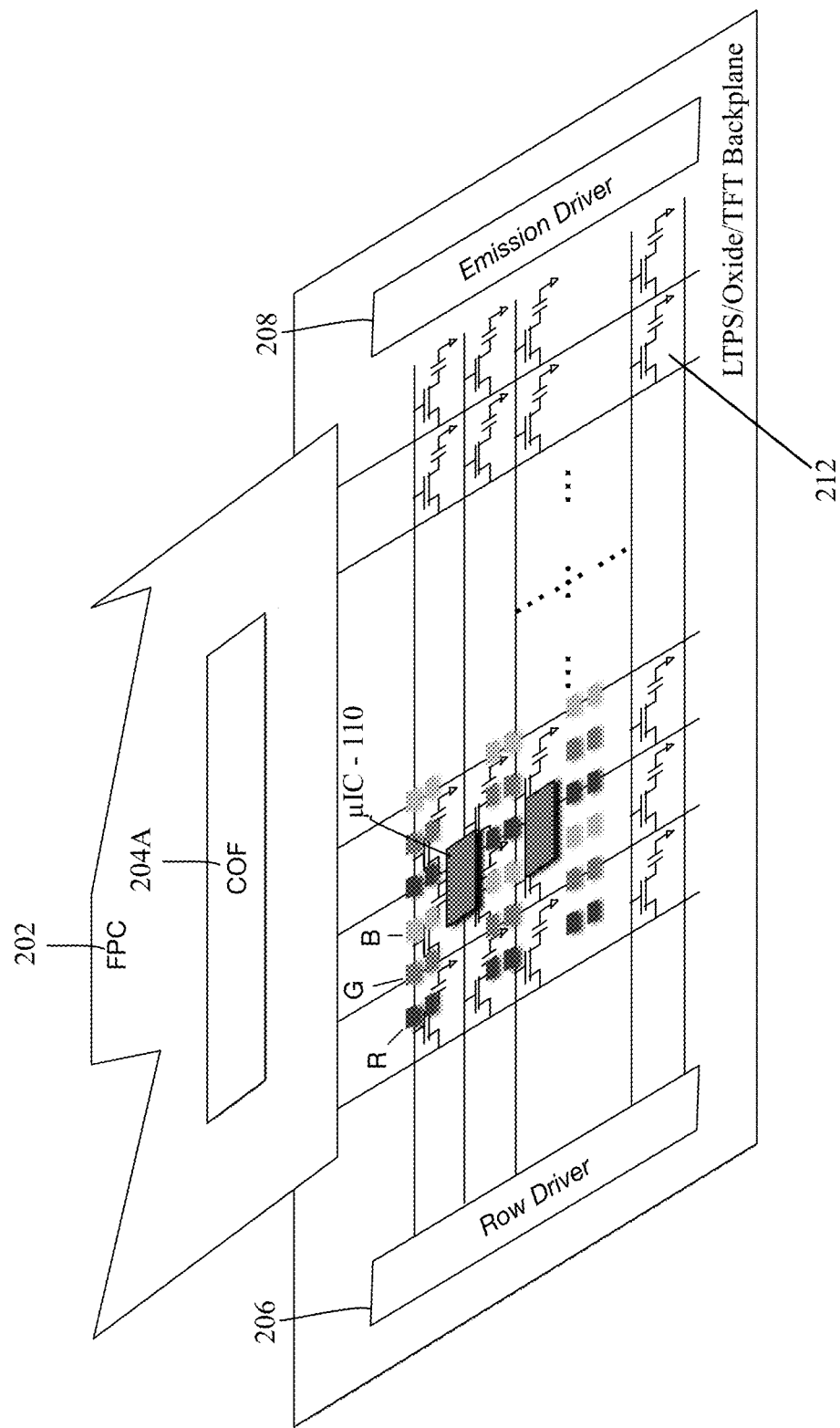
FIGS. 2A-B are block diagrams illustrating different views of an additional backplane-driver design, according to an embodiment.
Figure 2B:
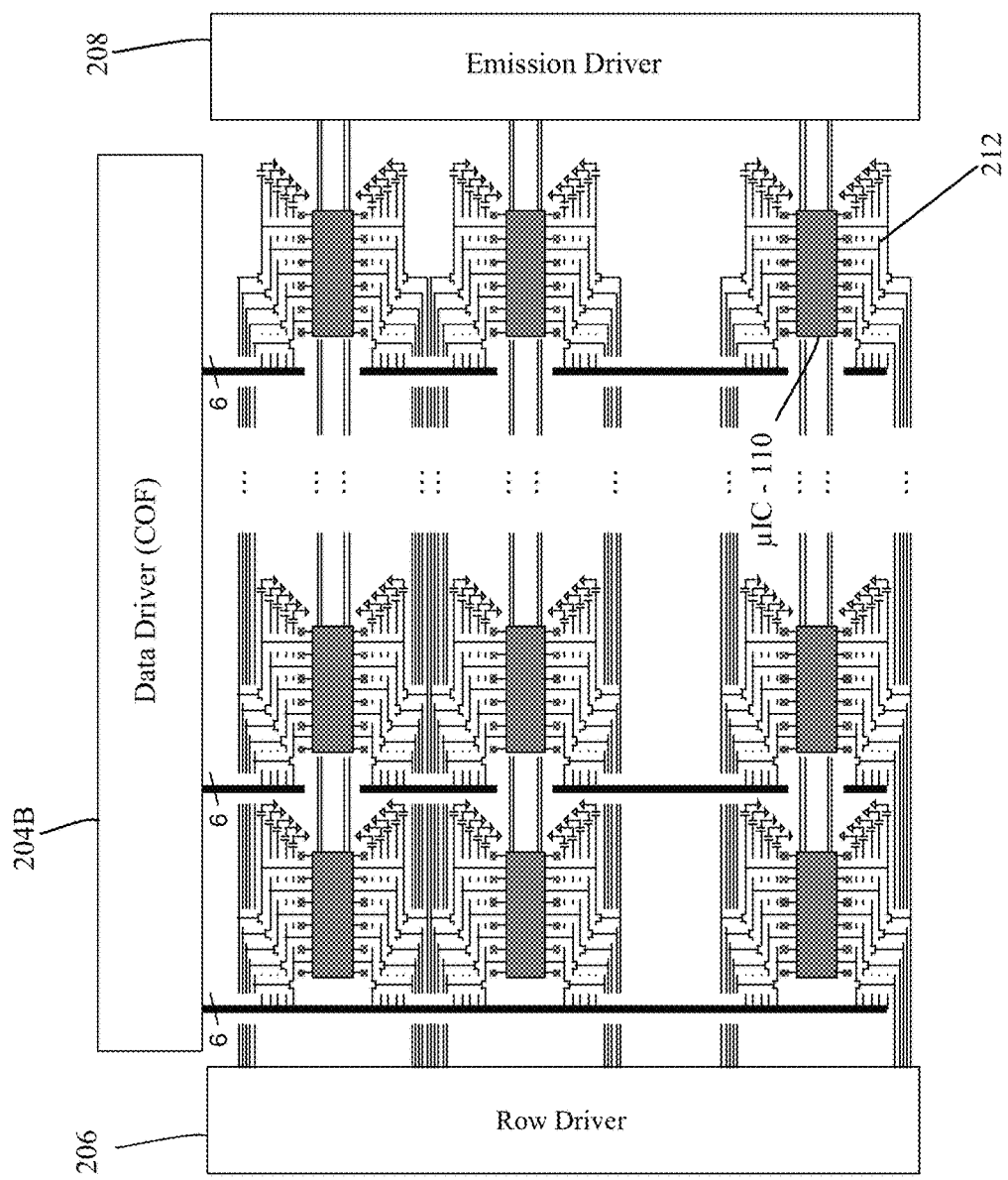

FIGS. 2A-B are block diagrams illustrating different views of an additional backplane-driver design, according to an embodiment. FIG. 2A illustrates an exemplary backplane driver design having a flexible printed circuit (FPC) and a chip on flex (COF) circuit. FIG. 2B illustrates a top-down view of the exemplary backplane driver design.

As illustrated in FIG. 2A, the backplane-driver design includes an FPC 202 coupled to an LTPS/Oxide TFT backplane 212. The FPC 202 can include a COF circuit 204A, which is an integrated circuit coupled to the FPC 202. In one embodiment a row driver 206 and an emission driver 208 couple to a TFT backplane 212, which may be an LTPS/Oxide TFT backplane. The TFT backplane 212 includes a sample and hold circuit having at least one transistor and one capacitor, although other sample and hold circuits may be used. A μDriver IC 110 couples to the TFT backplane 212 and a set of one or more light emitting devices (e.g., R, G, and B LEDs), where multiple light emitting devices can couple to a single instance of the μDriver IC 110.

FIG. 2B illustrates a top-down view of the exemplary backplane driver design, where a the row driver 206 and emission driver 208 are illustrated as coupled to the TFT backplane 212 in conjunction with a data driver 204B, which may be included in the COF circuit 204A shown in FIG. 2A. In one embodiment, the data driver 204B supplies pixel data values before the lighting elements are signaled for emission by the emission driver 208. The pixel data values are stored in capacitors selected by the row driver 206. After each line has been programmed with data, the emission driver 208 is responsible for sending the input to cause the illumination of the lighting elements for a pixel. In the illustrated display architecture, the data driver 204B controls the grey levels of the pixels and the emission driver 208 controls the brightness.

While the backplane driver architecture illustrated uses an active TFT matrix, in one embodiment, a passive matrix is employed, for example, when operational frequencies exceed the operational limits of the TFT backplane due to the low mobilities inherent in some TFT technologies. In a passive TFT matrix architecture, row and emission driving can be realized a chain of μDriver ICs 110 interconnected over a passive TFT backplane.

Figure 3:
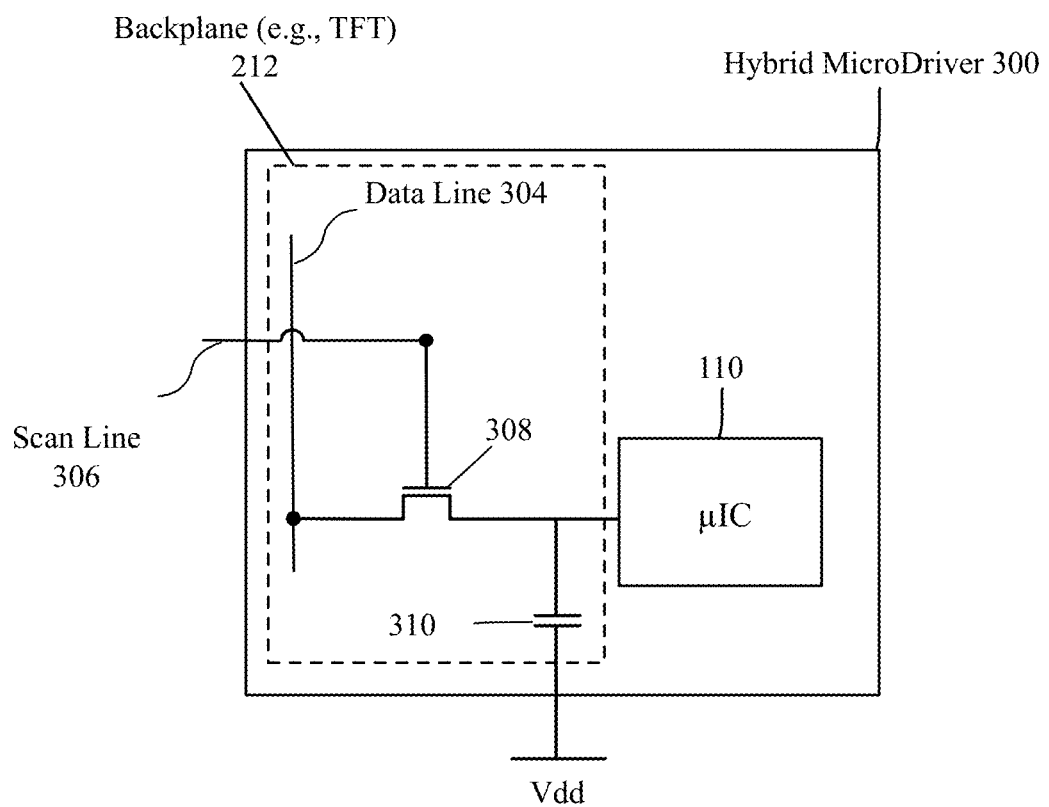
FIG. 3 is a block diagram of a basic circuit for a hybrid µDriver, according to one embodiment.

FIG. 3 is a block diagram of a basic circuit for a hybrid microdriver 300, according to one embodiment. The hybrid microdriver 300 includes a μDriver IC 110 coupled to a TFT backplane 212. The TFT backplane 212 includes components for a sample and hold circuit, including a switching transistor 308 and a storage capacitor 310. However, any variant of a sample and hold circuit suitable for use in a TFT backplane may be used. The switching transistor 308 can be any type of insulated-gate field-effect transistor, such an n-type or a p-type semiconductor transistor. In this configuration, the switching transistor 308 has a gate electrode coupled with an input from a scan line 306, a first source/drain electrode coupled with an input from a data line 304, and second source/drain electrode coupled with the storage capacitor 310. In one embodiment, a voltage scan signal enables the storage capacitor 310 to charge, which ultimately provides an input signal used to trigger an emission pulse from one or more LED devices coupled to the μDriver IC 110.

Figure 4:
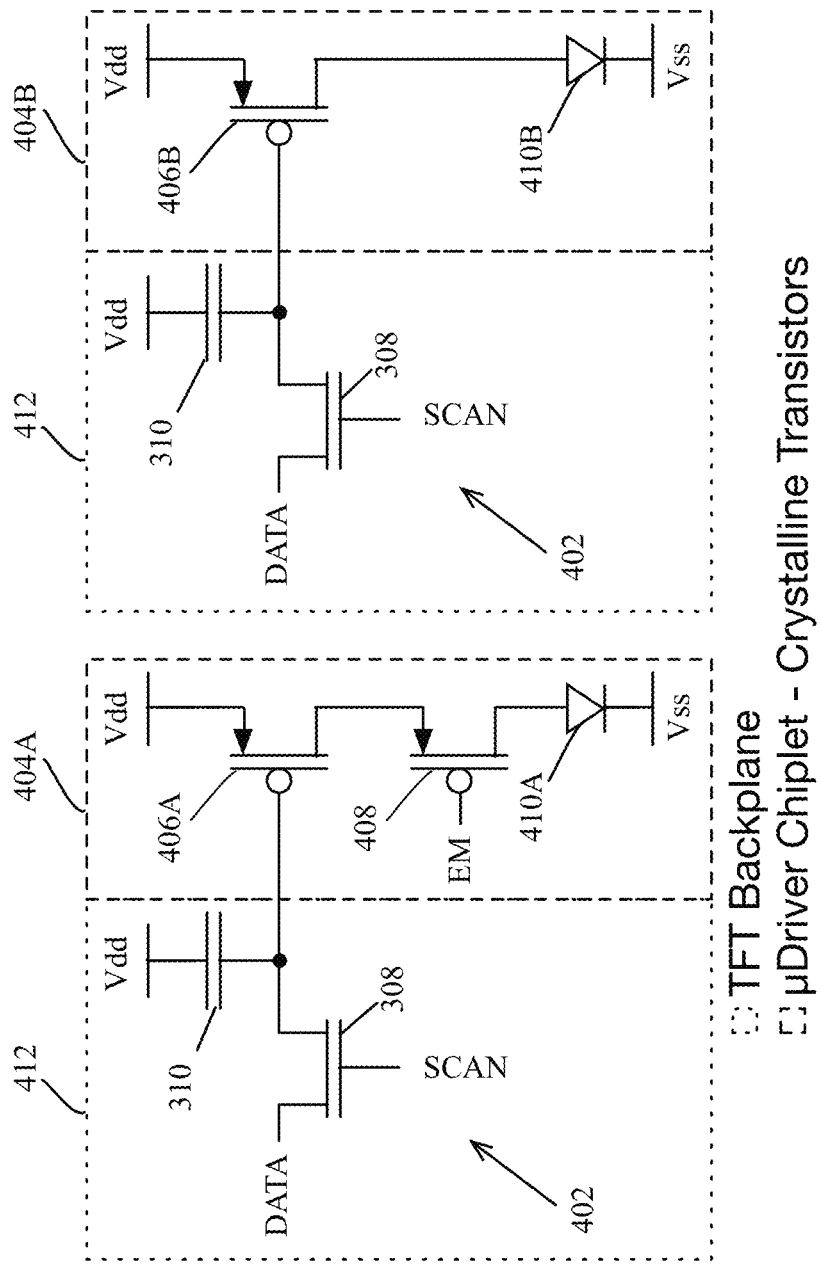
FIGS. 4A-B are circuit diagrams of two exemplary hybrid µDriver circuits.

FIGS. 4A-B are circuit diagrams of two exemplary hybrid microdriver circuits. Each exemplary hybrid microdriver circuit includes a sample and hold circuit 402 on a TFT backplane 412, including at least a switching transistor 308 and a storage capacitor 310. The sample and hold circuit 402 couples to data and address inputs that are analogous to the data and row inputs illustrated in other exemplary circuits described herein. The exemplary hybrid microdriver circuits each include a μD chiplet circuit 404A-B, which are each variants of the μDriver IC 110 of FIGS. 1-3. Each μD chiplet circuit 404A-B includes at least one drive transistor 406A-B to drive (O)LEDs 410A-B. The drive transistor 406A-B and can source large currents using minimal geometry. Simple examples of analog implementations of the proposed embodiment are presented here, where the sample and hold circuit 402 of the TFT backplane couples with each respective μD chiplet circuit 404A-B to form an analog-only 2T1C architecture version having a single drive transistor 406B, or a 3T1C architecture version having a drive transistor 406A and a separate switching transistor 408 as emission switch.

Figure 5:
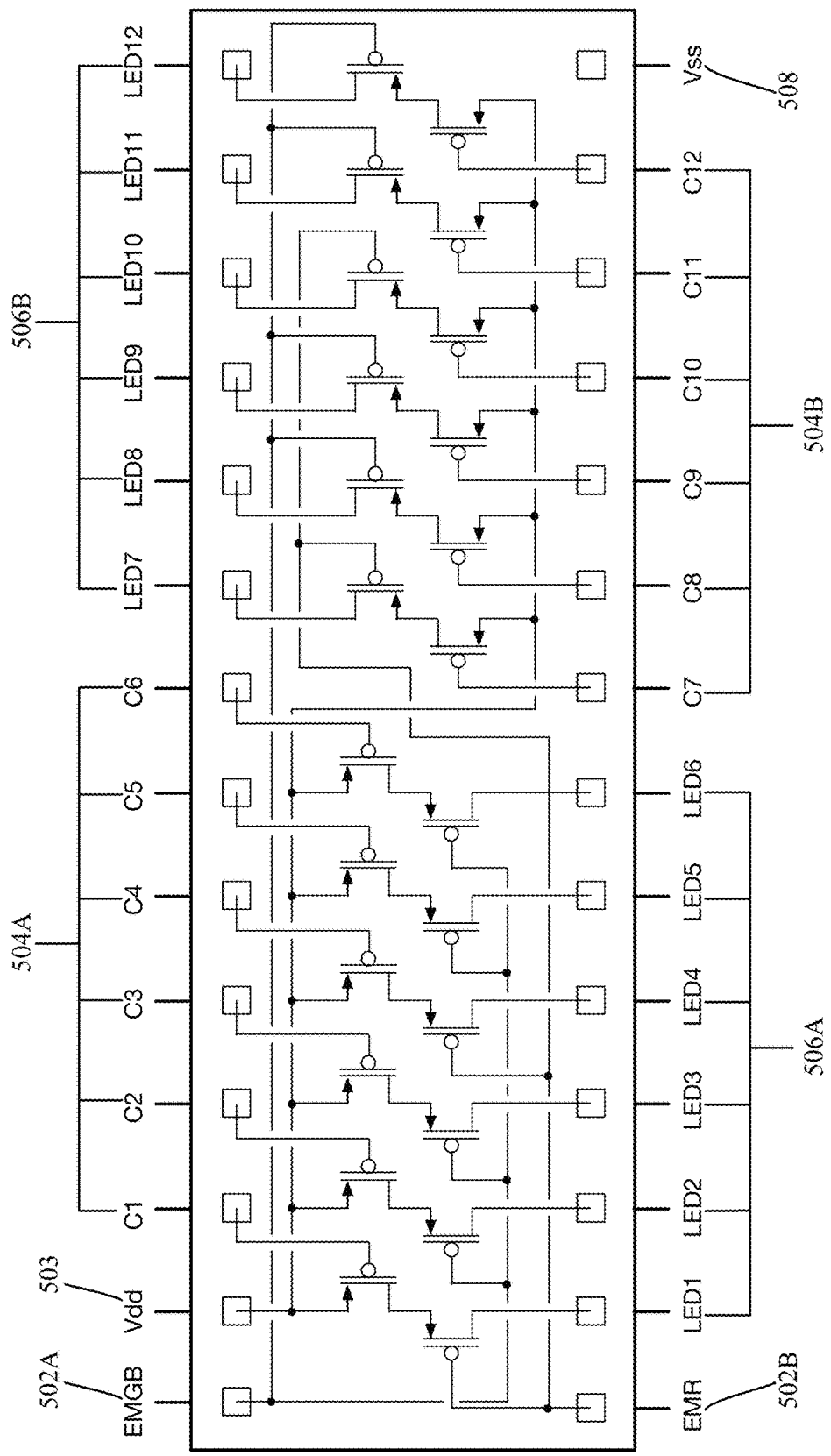
FIG. 5 is an illustration of an exemplary pad layout for a µDriver circuit.

FIG. 5 is an illustration of an exemplary pad layout for a microdriver circuit. Each microdriver circuit (e.g., μD chiplet, μDriver IC) includes a minimum number of pads, where the number of pads is defined by the number of sub-pixels controlled by the circuit, as well as the number, power and ground connections. The exemplary pad layout of FIG. 5 illustrates microdriver circuit configured to couple to a hybrid-backplane, where the circuit includes an emission switch transistor and a driving transistor. The circuit of FIG. 5 includes a power (Vdd) 503 input and a ground (Vss) 508 input, a green/blue emission control (EMGB) 502A, and a red emission control (EMR) 502B. Green and blue LEDs having a similar emission control profile may be used, allowing a shares emission control for those LEDs, while red LEDs have a separate emission control EMR 502B.

The microdriver circuit can drive a total of 12 sub-pixels (e.g., 4 RGB pixels) with 6 sub-pixels 506A (LED1-6) coupled to a first side of the microdriver circuit and 6 sub-pixels 506B (LED7-12) coupled to a second side of the microdriver circuit. A first set of control connections 504A (C1-6) can be used to set a gray level for the first set of sub-pixels 506A, while a second set of control connections 504B (C7-12) can be used to set a gray level for the second set of sub-pixels 506B, where each control line in each set of control lines 504A-B corresponds to a separate and respective sub-pixel 506A-B. The control connections 504A-B are connections to the storage capacitor terminals implemented on a TFT backplane, and the EMGB 502A and EMR 502B lines can be run in a layer physically underneath the driving and emission transistors.

Analog Input with Emission Pulse Width Modulation

Some types of light emitting devices, such as the μLEDs described herein, are generally driven at currents in the order of several tens of micro-amperes to achieve highest efficiency and lowest μLED power, which is a relatively high current for such class of devices. In traditional active-matrix TFT displays, LTPS or Oxide (e.g. IGZO or Indium Gallium Zinc Oxide) TFTs are sufficient to drive displays based on liquid crystal or organic LED technology. However, existing TFTs are not optimal for providing the relatively high currents used for μLEDs without employing large size TFTs or utilizing a large amount of power to drive the TFTs.

The crystalline silicon MOSFETs used in the uDriver ICs described herein have a mobility at least an order of magnitude higher than the LTPS TFTs used for backplane components and are more suitable to generate the current used to drive μLEDs. Additionally, the μLEDs described herein are more suitably driven using a constant current and modulating brightness using PWM based driving techniques, where emission levels can be determined as a function of the gray level input.

While one approach to generate a PWM signal is to provide digital n-bit data to every pixel and generate an emission pulse width as a function of digital data. This approach can utilize digital memory such as SRAM or flops, counters along with transistors as current sources, and emission control switches. However, such digital data driving approaches differ significantly from traditional display designs and may be difficult to integrate into traditional display technology in which analog voltage (e.g. 0-5V) is applied on the data line for grey scale control. Additionally while digital driving techniques may result in a simpler backplane design, including all pixel-driving circuits within the μDriver may result in a large and overall expensive design. To reduce the size and design complexity of the digital μDriver, some μDriver capacitors and switching transistors can be placed on a TFT backplane. The use of analog driving techniques may also simplify the integration of crystalline silicon based µDriver technology into existing displays.

FIG. 6A is an illustration of pulse width modulation (PWM), also referred to as pulse length modulation, in which the pulse width or length sets the emission level, in accordance with an embodiment. A constant current can be used to drive the light emitting elements, where the length in which the current is supplied determines the duty cycle of the light emitting element. As illustrated, a longer pulse width or length corresponds to a higher brightness, with a narrower pulse corresponding to a lower brightness, where pulsing the emission of the light emitting element changes the perceived brightness of the element. Three pulse widths are illustrated, in which a long duration pulse 602 results in a high perceived emission brightness due to a longer emission duty cycle, a medium duration pulse 604 results in a medium perceived emission brightness due to a medium emission duty cycle, and a short duration pulse 606 results in a low perceived emission brightness due to a low emission duty cycle.

FIG. 6B is an illustration of PWM determination in a microdriver based on a voltage ramp and an input data voltage according to embodiments. Embodiments described herein can be configured to generate an LED pulse 610 at a constant current with a specific emission duty cycle based on a comparison between an increasing voltage comparator ramp 608 and an input data voltage (Vdata) 612. The input data voltage (Vdata) 612 is constant within a pulse period and can be supplied to a microdriver circuit from the storage capacitor of a sample and hold circuit in a TFT backplane. The comparator ramp 608 can be supplied by a circuit external to the microdriver or can be 'locally' generated within the microdriver circuit. The comparator ramp 608 is an increasing voltage that is compared to the input data voltage. Circuitry within the microdriver uses a comparison between the increasing voltage (Vramp) of the comparator ramp 608 and the input data voltage (Vdata) 612 to determine a length of the LED pulse 610. In one embodiment, a constant current (ILED) is output to the LED as long as the Vramp of the comparator ramp 608 is less than the input data voltage (Vdata) 612. When (Vramp) of the comparator ramp 608 exceeds (Vdata) 612, the current to the LED is shut off.

Multiple implementations of a microdriver circuit will be described to perform the PWM driving techniques of FIGS. 6A-B. In various embodiments, microdriver circuits can use differing comparison techniques and circuit designs to compare the data voltages with the voltage ramp to generate an emission pulse. The circuitry to generate the ramp signal used to determine the emission pulse width may be located in the row driving circuitry, timing control circuitry, or may be generated within the microdriver integrated circuit.

Described herein are several analog hybrid microdriver circuit designs and associated simulated and measured outputs. Each design provides for constant current driving of a light-emitting device. Designs provided in some embodiments are particularly suited for driving µLED devices as described herein, but may also be used to drive other light emitting devices. In one embodiment, a microdriver circuit includes a locally generated voltage ramp and an emission override input. One embodiment additionally includes a voltage threshold engineered transistor to reduce power and enable enhanced control over emission pulse duration. In one embodiment, a hybrid LED driving circuit includes an oxide TFT having a sample and hold circuit, an LTPS TFT having voltage ramp generation circuit with voltage threshold compensation, and a microdriver integrated circuit to drive a set of emissive elements.

In the exemplary circuits of the accompanying figures and as described below, certain specific details such as a number of input and output pads or specific power figures are described. It will be understood that the specific details of each circuit are exemplary of one implementation, and embodiments may vary in these specific details without violating the spirit of the invention described herein.

Exemplary Hybrid Analog PWM µLED Driving Circuit

Figure 7:
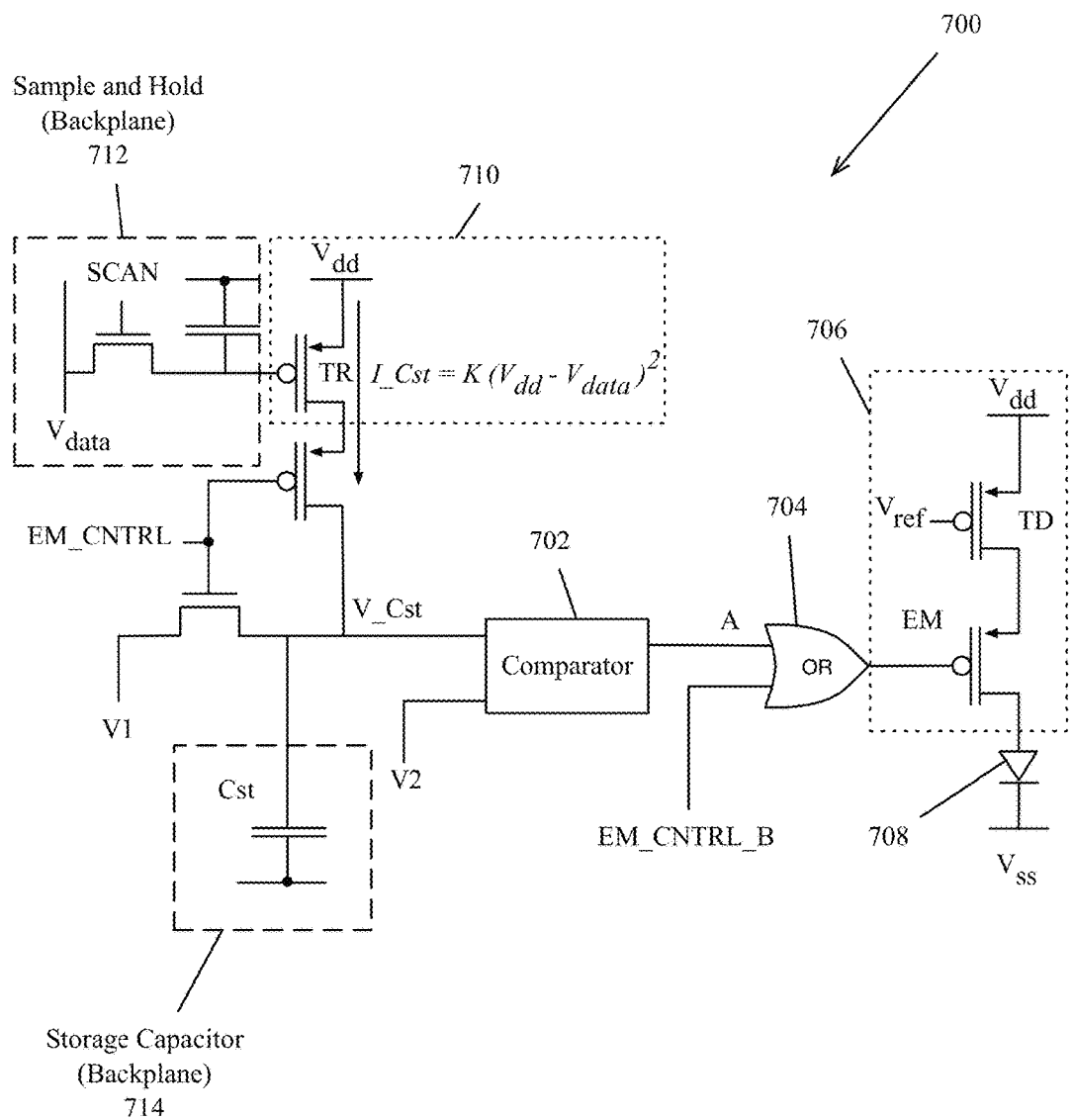
FIG. 7 is a circuit diagram of a hybrid-analog PWM LED driving circuit, according to an embodiment.

FIG. 7 is a circuit diagram of a hybrid-analog PWM LED driving circuit 700, according to an embodiment. The PWM LED driving circuit 700 is illustrated as driving a single LED or sub-pixel element. However, multiple circuits may be used to drive multiple sub-pixels for a display. The PWM LED driving circuit 700 includes backplane components that provide input to components within a µDriver IC. In one embodiment, the PWM LED driving circuit 700 includes backplane components including an exemplary sample and hold circuit 712 having a SCAN (e.g., Vselect) and Vdata inputs and an additional backplane storage capacitor (Cst 714).

In one embodiment the µDriver IC component includes a comparator 702, an OR gate 704, an LED drive circuit 706, and a ramp signal generator 710. The OR gate 704 has a first input A from the comparator 702 and a second input from an EM_CNTRL_B input. The ramp signal generator 710 receives input from the sample and hold circuit 712 on the backplane, while the LED drive circuit 706 couples to and drives current for an attached LED 708. In one embodiment the attached LED 708 is a µLED. However, the attached LED 708 may also be a standard LED, organic LED, or another current driven light emitting device. Additionally, one or more LEDs may be attached. Where the one or more attached LEDs 708 are µLEDs, the µLEDs may be transferred to the display substrate via an electrostatic transfer head array.

An exemplary drive cycle for the PWM LED driving circuit 700 is as follows. Upon assertion of the SCAN input to the sample and hold circuit 712, an input voltage Vdata is applied to the TR gate in the ramp signal generator 710. A voltage to current conversion occurs in which transistor TR of the ramp signal generator 710 generates a current I_Cst, which is a square function of applied Vdata. Where K is the dielectric constant of TR, the current I_Cst is computed as:

$$I_{Cst}=K(V_{dd}-V_{data})^2$$

Accordingly, as with a traditional (e.g., OLED) display, gamma can be achieved via a voltage to current conversion. The EM_CNTRL_B signal coupled to the OR gate 704 is asserted (e.g., triggers high) to ensure that EM is not enabled, keeping the LED 708 from emitting. The EM_CNTRL signal also triggers high to discharge Cst 714 and to isolate Cst 714 from TR. Ramp generation at the ramp signal generator 710 begins when EM_CNTRL is de-asserted and I_Cst charges Cst 714. Charging Cst 714 generates a ramp voltage V_Cst, the slope of which is a function of the applied data voltage (Vdata).

In one embodiment, actual emission of the LED 708 is moderated by EM_CNTRL_B, and emission does not begin until de-assertion of the EM_CNTRL_B signal triggers emission enable. The sub-pixel circuits can be configured such that all sub-pixels in a row start emission at the same time. At emission enable, the LED 708 will begin to emit based on current supplied by TD of the LED drive circuit 706, which is determined in part by the voltage (Vref) supplied to TD.

At the comparator, 702, the ramp voltage V_Cst and a reference voltage V2 are compared. V2 is the reference voltage to which V_Cst is compared, and defines the threshold in which the comparator will trip. When the ramp voltage V_Cst becomes equal to V2, the comparator trips, generating output signal A to the OR gate 704, which pulls the EM signal high and disables emission by disabling the current flow to the LED 708 from TD. Accordingly, the LED pulse width is function of applied data voltage (Vdata).

The LED reference voltage (Vref) supplied to TD controls the final current through the LED. Each of V2 and (Vref) can be adjusted for dimming control. The EM_CNTRL_B signal maintains EM high to disable emission completely for black level. Accordingly, EM_CNTRL_B may be enabled before EM_CNTRL and remain high until after comparator (e.g., input A to the OR gate 704) becomes high if the subpixel is intended to emit a completely black level.

Figure 8:
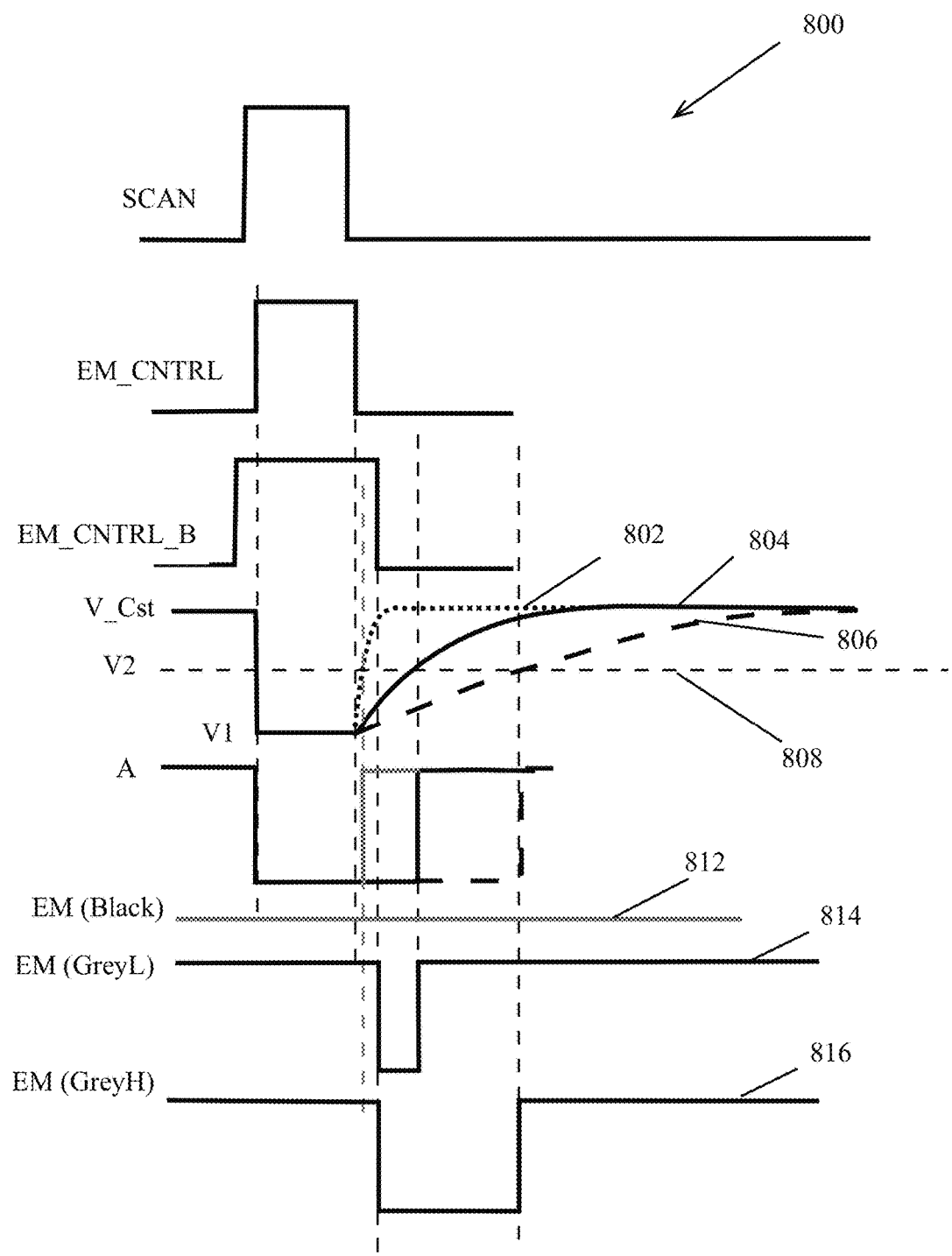
FIG. 8 shows an exemplary timing diagram for the PWM LED driving circuit.

FIG. 8 shows an exemplary timing diagram 800 for the PWM LED driving circuit 700 of FIG. 7. As illustrated, asserting a SCAN input (e.g., Vselect) and EM_CNTRL input prepares the PWM LED driving circuit 700 for emission, while the EM_CNTRL_B, V1, and V2 can shape the length of the pulse. Charging the storage capacitor (Cst 714) shown in FIG. 7 causes the V_Cst voltage ramp. Starting from input voltage V1, the V_Cst voltage ramp can vary between a short ramp 802, a medium ramp 804, and a long ramp 806, and has a slope based on the input data voltage (e.g., Vdata). For the PWM LED driving circuit 700 of FIG. 7, a higher Vdata results in a longer emission pulse. Once the V_Cst voltage exceeds the V2 voltage 808 the comparator triggers high, causing internal signal A to trigger, ending the emission pulse. If EM_CNTRL_B is asserted until after input A is triggered, no emission pulse will occur (e.g., EM(Black)) 812. Otherwise, emission pulses of varying lengths, from a low gray level pulse (e.g., EM (GrayL) 814 based on a medium ramp 804 to a high gray level pulse (e.g., EM (GrayH)) 816 based on a long ramp 806. Varying V2 and V1 can adjust the length of the emission pulse as needed.

Figure 9:
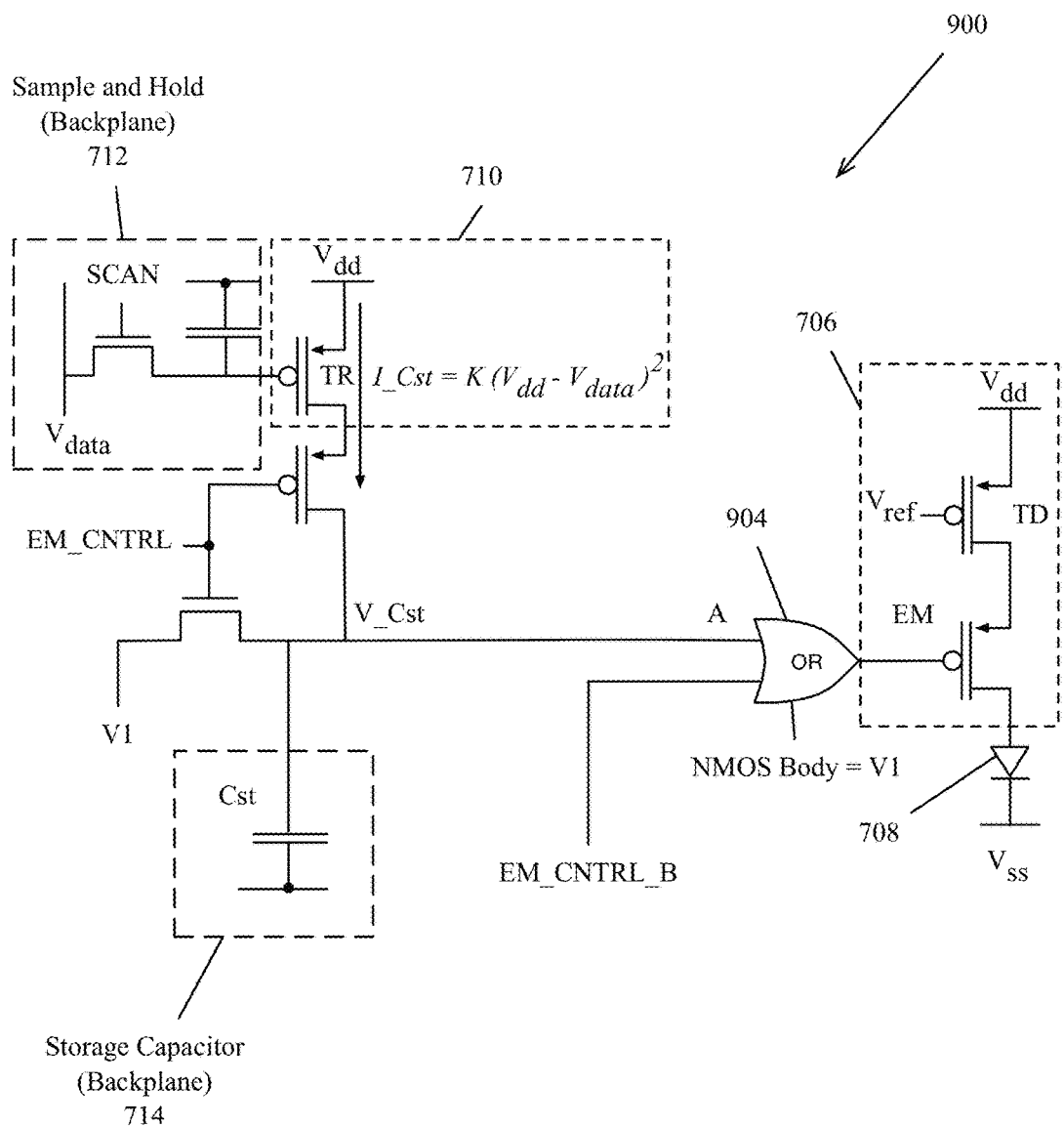
FIG. 9 is a circuit diagram of a threshold-engineered hybrid-analog PWM LED driving circuit, according to an embodiment.

FIG. 9 is a circuit diagram of a threshold-engineered hybrid-analog PWM LED driving circuit 900, according to an embodiment. The threshold-engineered hybrid-analog PWM LED driving circuit 900 is similar to the hybrid-analog PWM LED driving circuit 700 of 7, with optimizations to reduce circuit complexity and power consumption. In one embodiment, a modified OR gate 904 is used, where the OR gate is an n-channel (e.g., NMOS) transistor OR gate. However, embodiments may use gate threshold adjustments on other transistors to adjust the switching threshold of the transistors as needed. Generally, the threshold voltage for a transistor is a function of the voltage applied to the substrate and the doping index of the transistor. Generally, the substrate terminal is tied to the source terminal, such that the source and body voltage are equal. However, the voltage threshold of the NMOS transistors of the OR gate 904 can be tied to a different voltage source. In one embodiment, the substrate (e.g., Body) supply voltage of an NMOS transistor coupled to the A input of the OR gate 904 is supplied a voltage (e.g., V1) to adjust the switching threshold for the A input, allowing the function of the comparator 702 of FIG. 7 to be performed by the OR gate 904 of PWM LED driving circuit 900.

In one embodiment the timing for PWM LED driving circuit 900 is similar to that of PWM LED driving circuit 700, which is illustrated in the exemplary timing diagram 800 of FIG. 8, excepting that the V2 reference comparator voltage, which is supplied to the comparator 702 of FIG. 7, is determined by the voltage threshold (Vth) of the A input NMOS of the OR gate 904 of PWM LED driving circuit 900.

Figure 10:
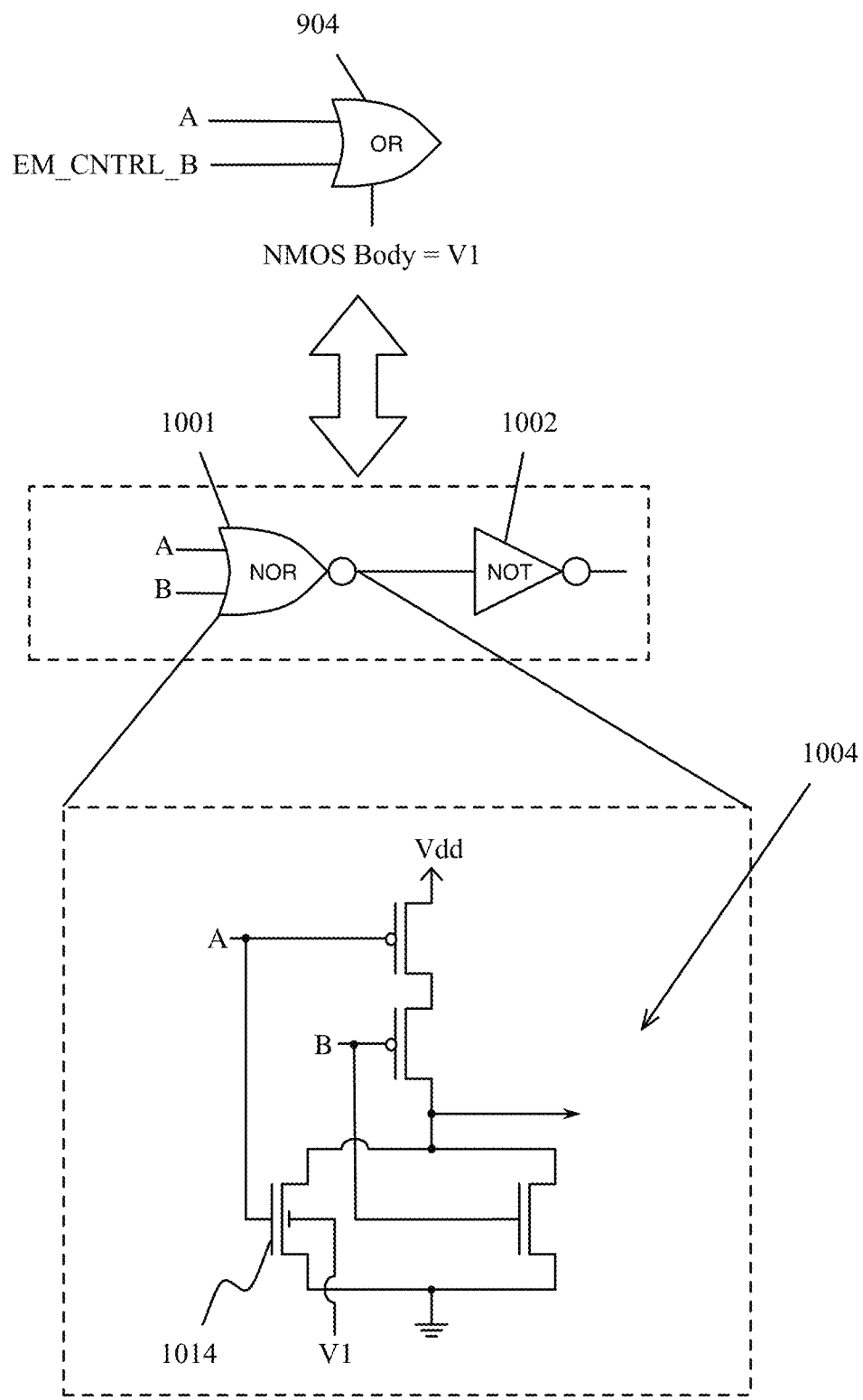
FIG. 10 is a circuit diagram of a portion of the threshold-engineered hybrid-analog PWM LED driving circuit, according to an embodiment.

FIG. 10 is a circuit diagram of a portion of the threshold-engineered hybrid-analog PWM LED driving circuit 900, according to an embodiment. In one embodiment, the OR gate 904 of FIG. 9 includes a NOR gate 1001 and an inverter (e.g., NOT gate 1002). The NOR gate 1001 can include a set of NMOS and PMOS transistors, illustrated by exemplary circuit diagram 1004. In one embodiment, an NMOS transistor 1014 associated with the A input to the OR gate can have a substrate terminal tied to a V1 input, which can be used to adjust the voltage threshold (Vth) of the NMOS transistor 1014. A negative voltage applied as a substrate bias (VB) to the NMOS substrate terminal can result a proportional increase to Vth.

Figure 11:
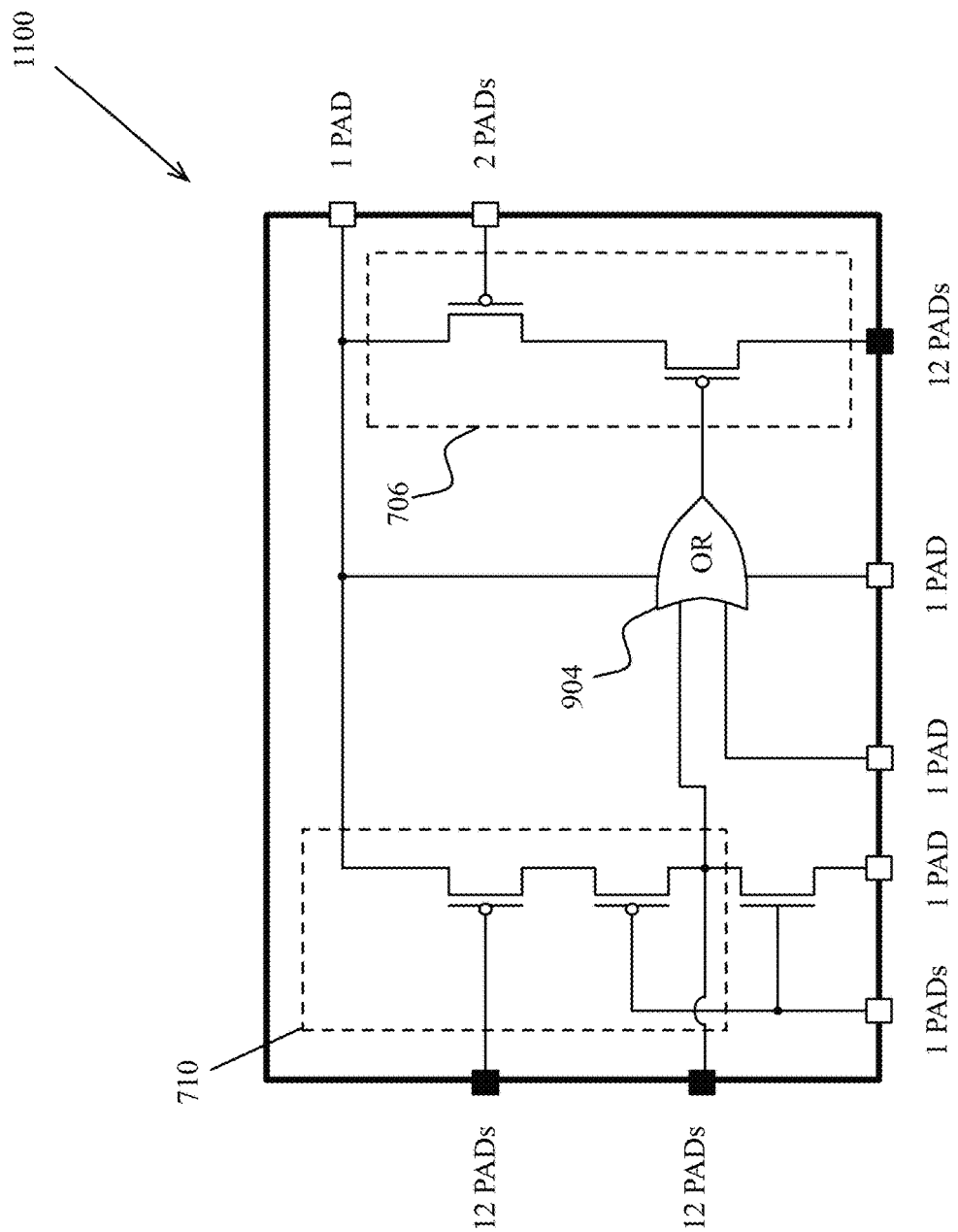
FIG. 11 is a circuit diagram illustrating pad counts for a µDriver integrated circuit, according to an embodiment.

FIG. 11 is a circuit diagram illustrating pad counts for a μDriver IC 1100, according to an embodiment. In one embodiment, including the ramp signal generator 710, OR gate 904, and LED drive circuit 706, as also illustrated in FIGS. 7 and 9, for a 12 subpixel driver, results in a pad count of 43 pads per chip for μDriver IC 1100. However, the precise pad count can vary among embodiments.

An integrated circuit having a large number of pads may be costly to manufacture, and it can be advantageous to modify the design of the μDriver IC 1100 to reduce the size and number of contact pads.

Exemplary Hybrid Analog PWM μLED Driving Circuit Having LTPS Ramp Generation

Figure 12:
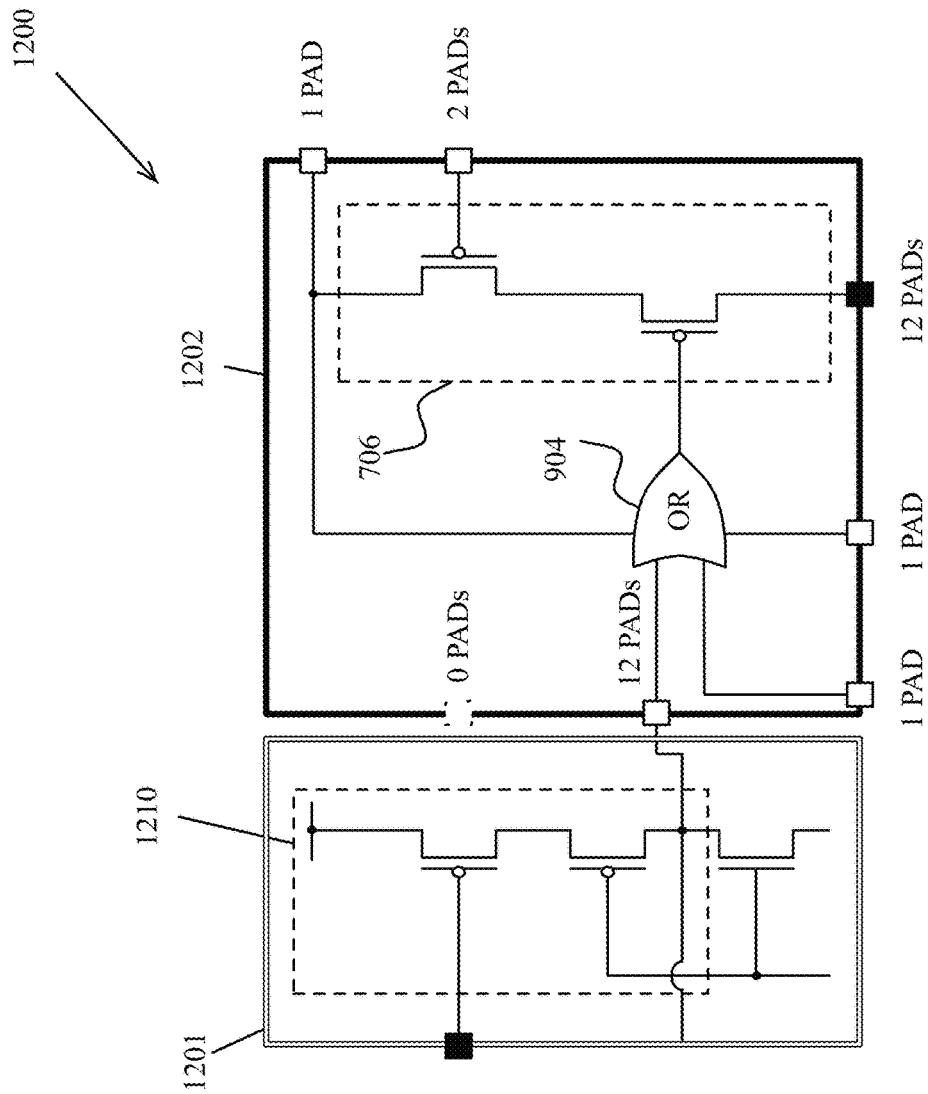
FIG. 12 is a circuit diagram illustrating pad counts for an additional µDriver integrated circuit, according to an embodiment.

FIG. 12 is a circuit diagram illustrating pad counts for an additional μDriver IC 1200, according to an embodiment. In one embodiment, a μDriver IC 1200 includes a TFT based ramp signal generator 1210 comprised of LTPS TFTs positioned in a TFT backplane 1201. The TFT based ramp signal generator 1210 can couple to a μDriver IC 1202 having a reduced size and pad count relative to the μDriver IC 1100 of FIG. 11. Although the ramp signal generator is TFT based and couples to the μDriver IC 1202, the operation of the μDriver IC 1200 is similar to the operation of the threshold-engineered hybrid-analog PWM LED driving circuit 900 of FIG. 9. However, moving the ramp signal generator 1210 to the TFT backplane 1201 results a pad connection count reduction from 43 pads per chip for 12 subpixels to 29 pads per chip for 12 subpixels. The reduced number of pad connections enable a reduced size, manufacturing complexity and cost of the μDriver IC 1200.

Exemplary Hybrid Analog PWM μLED Driving Circuit Having TFT Vth Compensation

Figure 13:
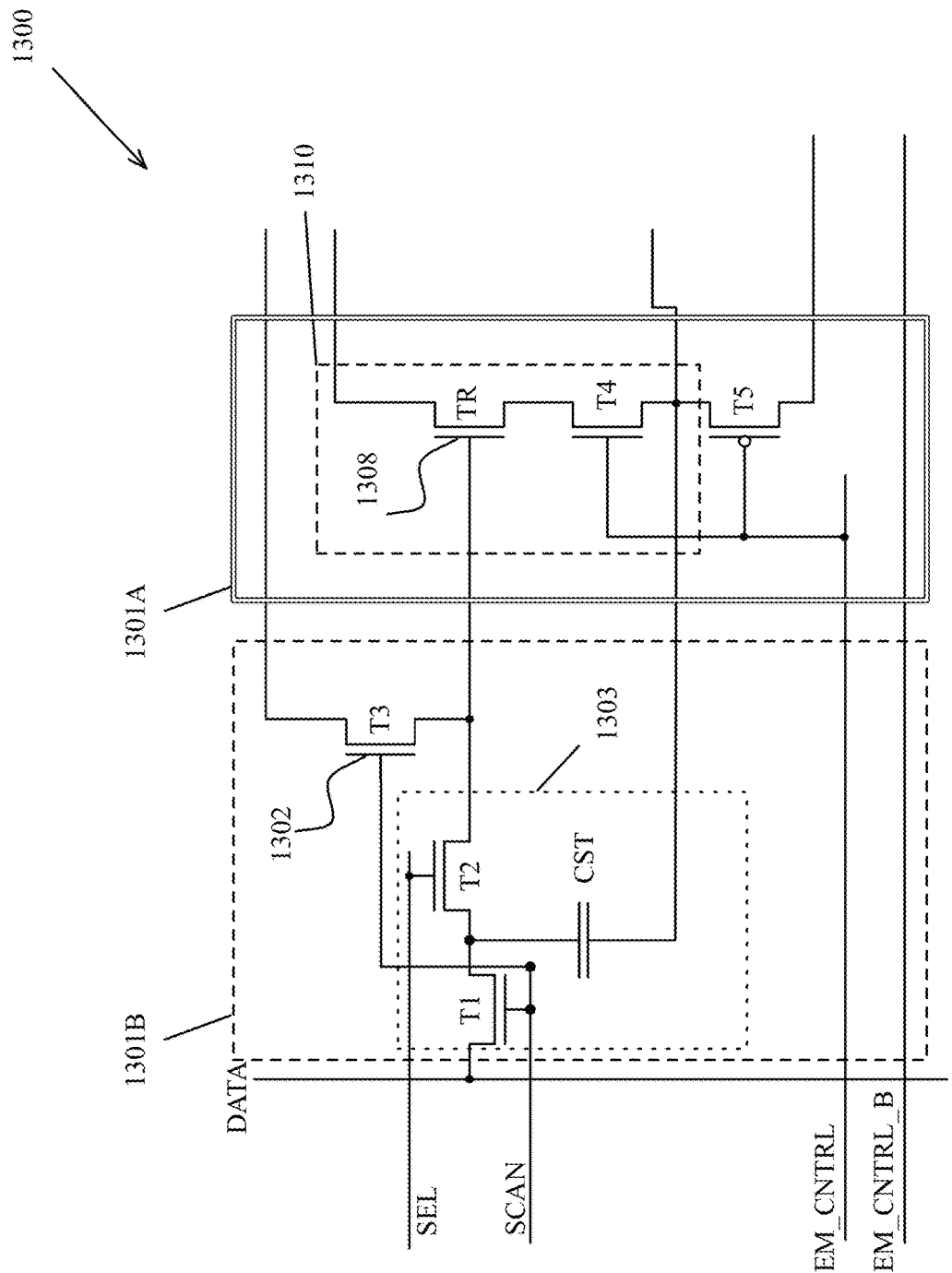
FIG. 13 is a circuit diagram of a portion of a TFT backplane of a hybrid analog PWM driving circuit having TFT based voltage threshold compensation, according to an embodiment.

In some embodiments it may be beneficial to combine the concepts of TFT basted ramp signal generation with n-channel (e.g., NMOS) voltage threshold (Vth) compensation instead of a p-channel transistor. Utilizing voltage threshold compensation to increase the maximum available emission pulse from the emission circuit, in one embodiment, utilizes a ramp signal generator including n-channel transistors rather than p-channel transistors, with an additional NMOS transistor to trigger the voltage threshold compensation. For LTPS TFTs, the use of n-channel transistors for ramp generation may be beneficial due to improved initial characteristics including Vth hysteresis, uniformity, and temperature dependence. Additionally, the use of n-channel LTPS transistors enables the adjustment of the ramp generator Vth FIG. 13 is a circuit diagram of a portion of a TFT backplane of a hybrid analog PWM driving circuit 1300 having TFT based voltage threshold compensation, according to an embodiment. In one embodiment, a ramp signal generator 1310 having NMOS transistor 1308 is included in a first TFT layer 1301A, which can be an LTPO TFT layer, while a sample and hold circuit 1303 and a voltage threshold compensation transistor 1302 can be included in a second TFT layer 1301B, which can be an oxide TFT layer. The voltage threshold compensation transistor 1302 is included to modify the threshold voltage of the of the NMOS transistor 1308 of the ramp signal generator 1310. In one embodiment, the oxide TFT layer 1301A includes a sample and hold circuit 1303 having switching transistor T1 coupled to SCAN input and switching transistor T2 coupled to SEL input. Within the sample and hold circuit 1303, transistor T1 and T2 each couple to storage capacitor CST. Additionally, input signal EM_CNTRL couples to the first TFT layer 1301A, while input signal EM_CNTRL_B couples to the µDriver IC (not shown).

Figure 14:
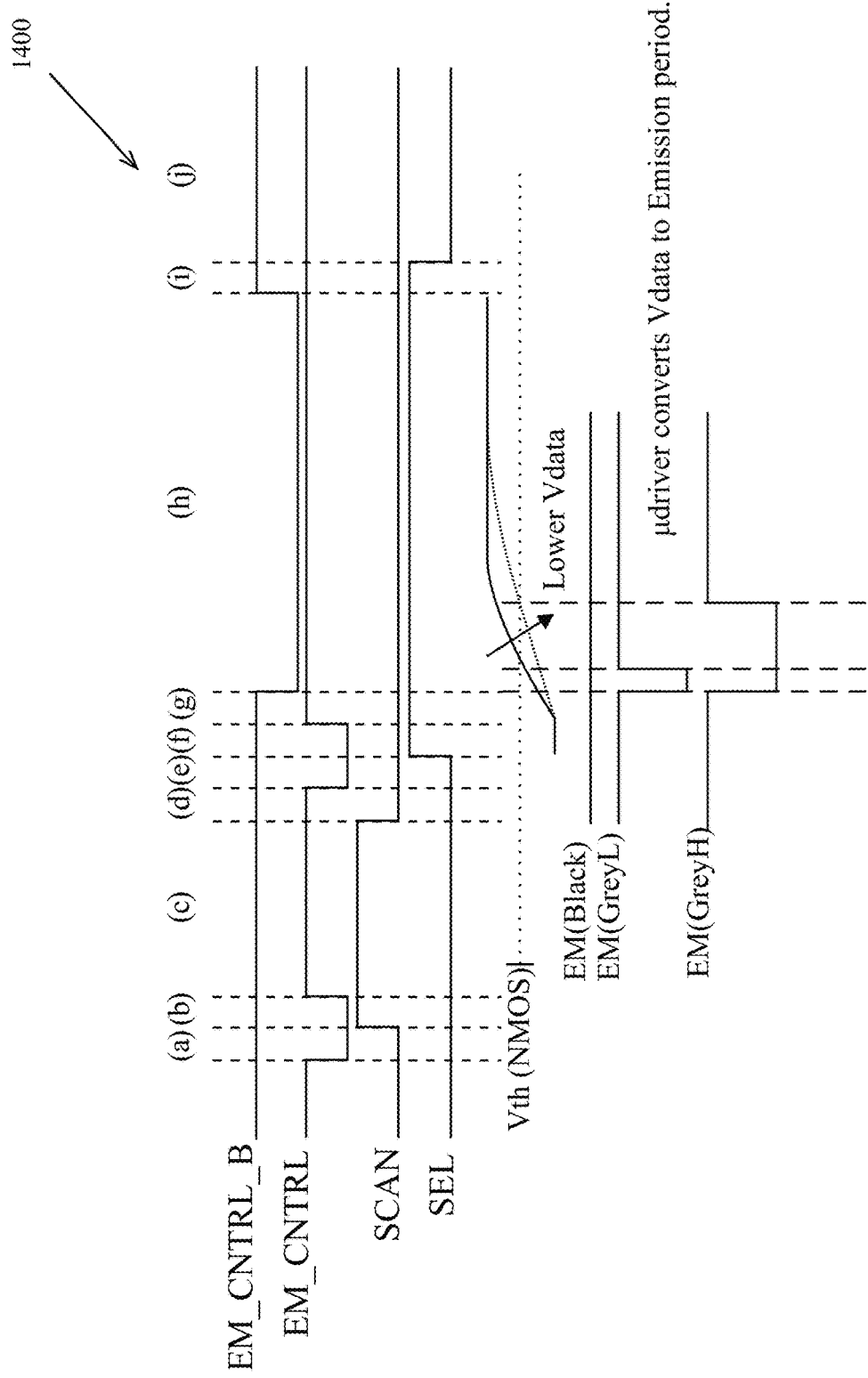
FIG. 14 is a timing diagram for a hybrid analog PWM driving circuit having TFT based voltage threshold compensation, according to an embodiment.

In one embodiment, a hybrid analog PWM driving circuit having a TFT backplane 1300 as in FIG. 13 operates as shown by the timing diagram 1400 as in FIG. 14. As shown by the timing diagram 1400 of FIG. 14, the emission pulse determination for the hybrid-analog LED driving circuit having the TFT backplane 1300 as in FIG. 13 includes a SCAN and a SEL input, where the SCAN input is used to charge the storage capacitor CST of the sample and hold circuit 1303 and SEL in conjunction with EM_CNTRL enables an emission pulse.

In the hybrid analog PWM driving circuit 1300 of FIG. 13 and the timing diagram 1400 of FIG. 13 the voltage threshold compensation transistor 1302 is tied to the SCAN input. However, a separate COMP input may also be used, as shown in FIG. 15, which is an additional circuit diagram of a hybrid-analog PWM LED driving circuit 1500 having a TFT based NMOS ramp signal generator and voltage threshold compensation, according to an embodiment.

Figure 15:
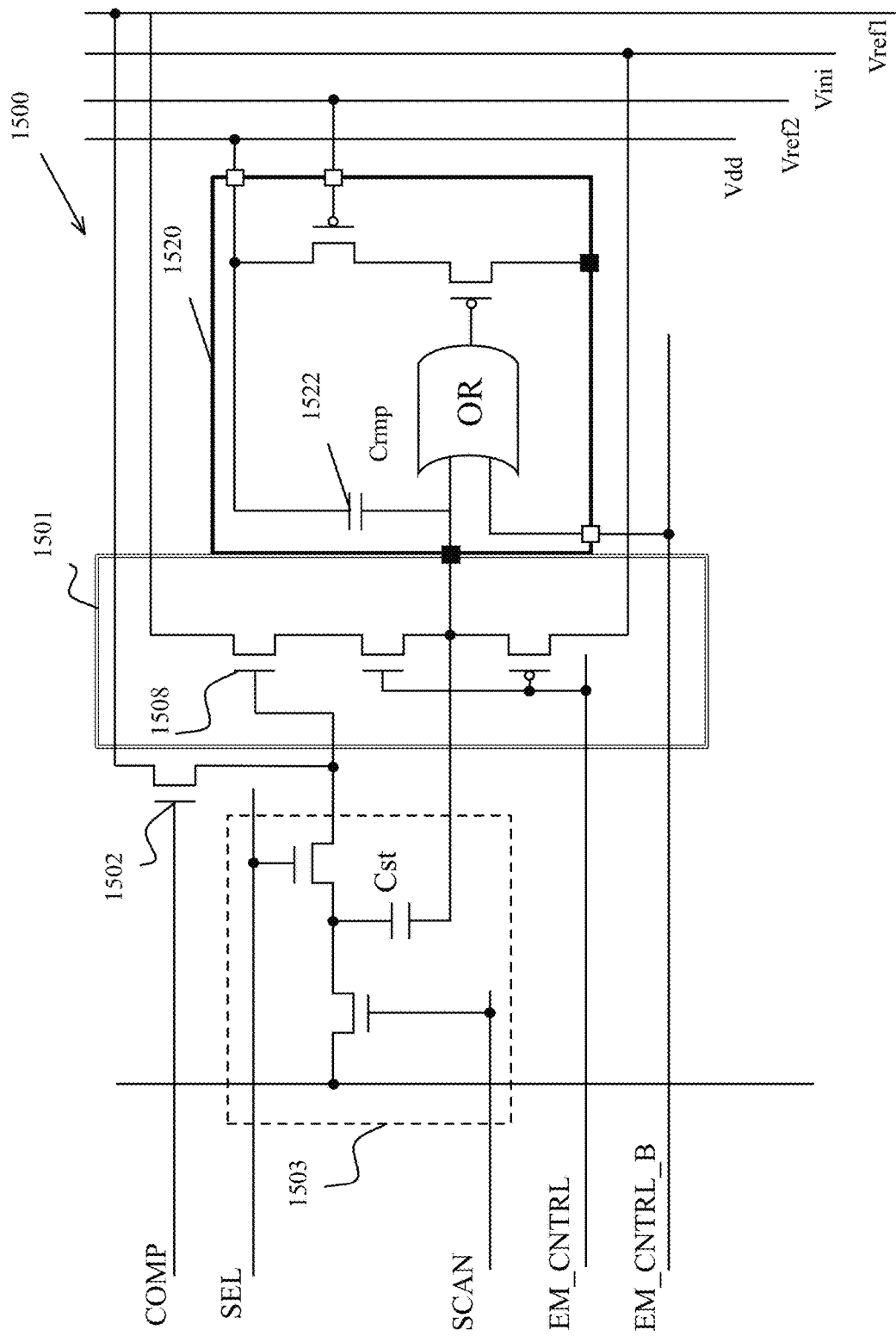
FIG. 15 is a circuit diagram of a hybrid-analog PWM LED driving circuit having a TFT based NMOS ramp signal generator and voltage threshold, according to an embodiment.

The illustrated PWM LED driving circuit 1500 of FIG. 15 includes a TFT layer 1501 having an n-channel transistor 1502 for voltage threshold compensation. In one embodiment the TFT layer 1501 is an LTPS TFT layer. The hybrid-analog PWM LED driving circuit 1500 has a first set of inputs including a SEL and SCAN input coupled to a TFT based sample and hold circuit 1503, which may be part of the TFT layer 1501, or a set of TFTs in a different layer and/or comprised of a different material, such as Indium Gallium Zinc Oxide. In TFT layer 1501, the compensation transistor 1502 couples to the gate of the ramp signal generator transistor 1508. The compensation transistor 1502, in one embodiment, may couple to a separate COMP input signal, or may be tied to the SCAN input as in FIG. 13.

In one embodiment the PWM LED driving circuit 1500 can couple to multiple different voltage sources including a power supply voltage Vdd, a voltage ramp initial voltage Vini, a voltage threshold compensation reference voltage Vref1, and an LED drive transistor reference voltage Vref2. In one embodiment the values of the voltages may be adjusted to tune the behavior of the circuit.

The PWM LED driving circuit 1500 additionally includes a µDriver IC 1520 that may be a variant of the PWM LED driver IC 1200 of FIG. 12 and may include a similar number of pad connections for input (e.g., 29 pads), although additional optimizations may further reduce the pad count. The µDriver IC 1520 can include a Crmp capacitor 1522 to store ramp/data voltage. During emission, a ramp signal is generated starting at an initial voltage which, in one embodiment is determined by Vdata-Vref1+Vth+Vini. The ramp signal proceeds to a final voltage of Vdata-Vref1+Vth+Vdd. Accordingly, the emission period (e.g., length of the emission pulse) is determined at least in part by Vdata (e.g., the data line voltage). A lower Vdata results in a shallow voltage ramp, which causes a longer emission period. In one embodiment, the PWM LED driving circuit 1500 has a timing diagram similar to the timing diagram 1400 of FIG. 14.

Hybrid MicroDriver Display System

Figure 16:
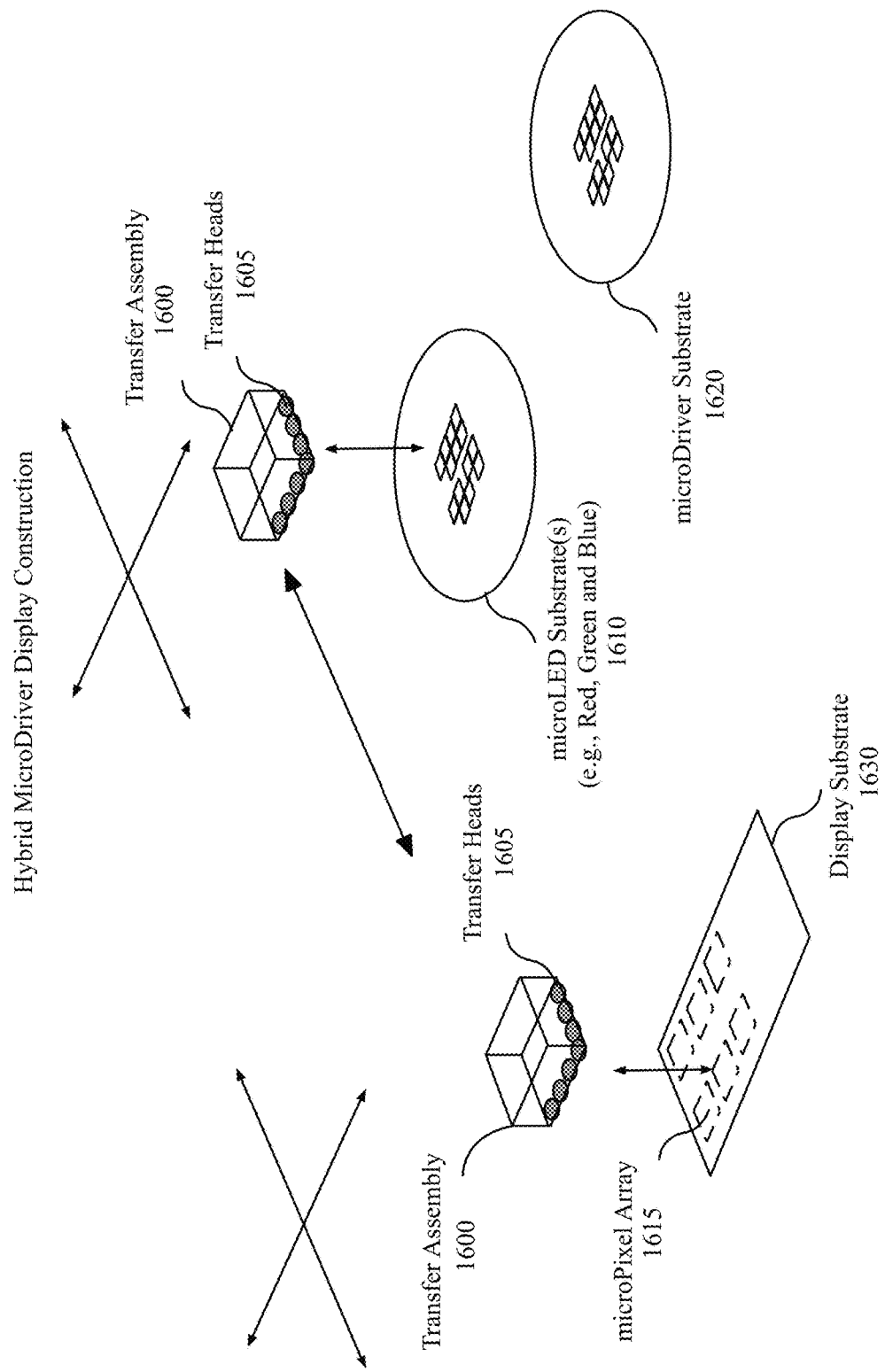
FIG. 16 illustrates the processing of substrates of µDriver and µLEDs into a receiving substrate for a hybrid µDriver and µLED display, according to an embodiment.

FIG. 16 illustrates the processing of substrates of µDriver and µLEDs into a receiving substrate for a hybrid µDriver and µLED display, according to an embodiment. In one embodiment, separate carrier substrates including one or more µLED substrate(s) 1610 and a µDriver substrate 1620. One or more transfer assemblies 1600 can be used to pick up and transfer microstructures from the carrier substrates (e.g., 1610, 1620) to the receiving display substrate 1630.

In one embodiment, transfer assemblies 1600 are used to transfer any combination of µLED colors from the µLED substrate 1610 and µDriver substrate 1620 may be separate. In one embodiment the display substrate 1630 is prepared with distribution lines to connect the various the µLED and µDriver structures. The display substrate can also be prepared with one or more layers of TFT components as described herein. The distribution lines can be coupled to landing pads and an interconnect structure to electrically couple the µLED devices, the µC devices, and the TFT components. The interconnect structure can also be designed to couple the various µC devices to each other to create a µDriver relay to enable communication between the µDriver ICs. The receiving substrate can be a display substrate 1630 of any size ranging from micro displays to large area displays, can be a lighting substrate for LED lighting, or for use as an LED backlight for an LCD display. In one embodiment the µLED and µDriver structures are bonded to the same side of the substrate surface. However, the µDriver and µLED structures may also be bonded to alternate sides of the substrate surface.

The µDriver and µLEDs are described herein as coupling to a substrate via connection pads. However, the bonds between the components can be made using various connections such as, but not limited to, pins, conductive pads, conductive bumps, and conductive balls. Metals, metal alloys, solders, conductive polymers, or conductive oxides can be used as the conductive materials forming the pins, pads, bumps, or balls. In an embodiment, heat and/or pressure can be transferred from the array of transfer heads 1605 to facilitate bonding. In an embodiment, conductive contacts on the µC, µLED devices, or other display components (e.g., sensor devices) are thermocompression bonded to conductive pads on the substrate. In this manner, the bonds may function as electrical connections to the µDriver IC and µLED devices. In one embodiment bonding includes indium alloy bonding or gold alloy bonding. Other exemplary bonding methods that may be utilized with embodiments include, but are not limited to, thermal bonding and thermosonic bonding.

The specifics of the display substrate 1630 can vary based on the target application. In one embodiment the display substrate 1630 is used to form a microPixel array 1615 for use in a high-resolution display. In one embodiment the microPixel array 1615 can have up to 440 pixels per inch, although other embodiments may be manufactured at higher PPIs.

Figure 17:
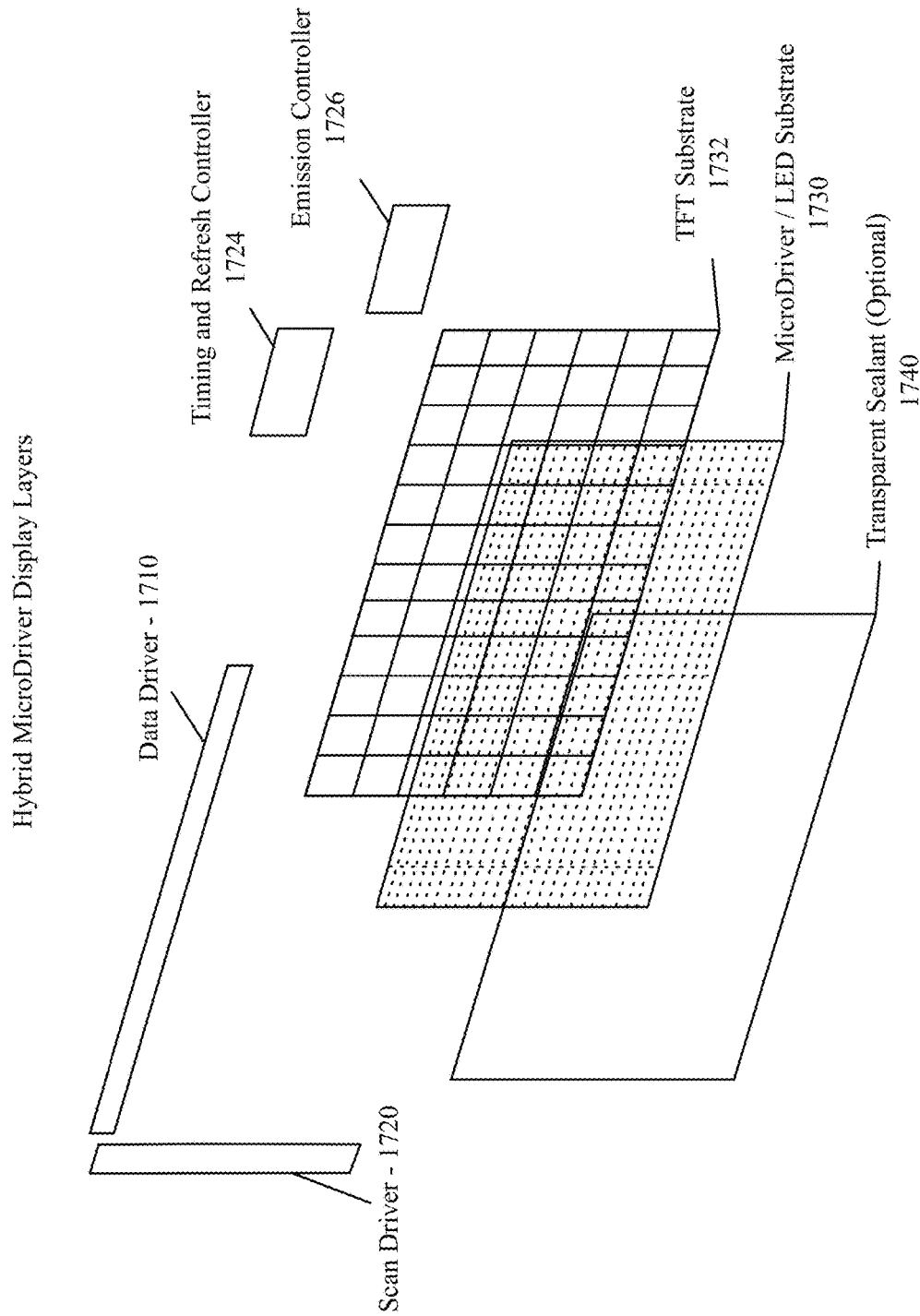
FIG. 17 is an illustration of a hybrid µDriver display, according to an embodiment.

FIG. 17 is an illustration of a hybrid micro-driver display, according to an embodiment. In one embodiment, a µDriver and LED receiving substrate 1730 is a micro-matrix that is prepared with distribution lines to couple the micro-matrix of µDriver IC devices and LEDs (e.g., µLEDs, OLEDs, etc.) to one or more display controllers. In one embodiment, the receiving substrate 1730 is a display substrate, and multiple assemblies including µLEDs and µDriver ICs interconnect to form a high-resolution display system. In one embodiment a TFT substrate 1732 including LTPS and/or Oxide transistors and capacitors couple to the µDriver/LED receiving substrate 1730. An optional sealant 1740 can be used to secure and protect the substrate. In one embodiment, the sealant is transparent, to allow a display or lighting substrate with top emission LED devices to display through the sealant. In one embedment, the sealant is opaque, for use with bottom emission LED devices. In one embodiment an optional a data driver 1710 and a scan driver 1720 couple with multiple data and scan lines on the display substrate. In one embodiment, each of the smart-pixel devices couple with a refresh and timing controller 1724. The refresh and timing controller 1724 can address each LED device individually, to enable asynchronous or adaptively synchronous display updates. In one embodiment, an emission controller 1726 can couple with the micro-driver/LED receiving substrate 1730 to control the brightness of LEDs, for example, via manipulation of emission control inputs. In one embodiment the emission controller 1726 can couple with one or more optical sensors to allow adaptive adjustment of emission pulse length based on ambient light conditions. The emission controller 1726 can adjust display brightness via manipulation of initial and reference voltages (e.g., Vini, Vref1, Vref2, as in FIG. 15).

A display system may additionally include a receiver to receive display data from outside of the display system. The receiver may be configured to receive data wirelessly, by a wire connection, by an optical interconnect, or any other connection. The receiver may receive display data from a processor via an interface controller. In one embodiment, the processor may be a graphics processing unit (GPU), a general-purpose processor having a GPU located therein, and/or a general-purpose processor with graphics processing capabilities. The display data may be generated in real time by a processor executing one or more instructions in a software program, or retrieved from a system memory. A display system may have any refresh rate, e.g., 50 Hz, 60 Hz, 100 Hz, 120 Hz, 200 Hz, or 240 Hz.

Depending on its applications, a display system may include other components. These other components include, but are not limited to, memory, a touch-screen controller, and a battery. In various implementations, the display system may be a television, tablet, phone, laptop, computer monitor, automotive heads-up display, automotive navigation display, kiosk, digital camera, handheld game console, media display, e-book display, or large area signage display.

In utilizing the various embodiments of this disclosure, it would become apparent to one skilled in the art that combinations or variations of the above embodiments are possible for controlling emission of a display panel. Although the present disclosure has been described in language specific to structural features and/or methodological acts, it is to be understood that the disclosure defined in the appended claims is not necessarily limited to the specific features or acts described. The specific features and acts disclosed are instead to be understood as particularly graceful implementations of the claimed disclosure useful for illustrating the present disclosure.

The invention claimed is:

1. A display driver hardware circuit comprising:
   a thin film transistor (TFT) backplane;
   an integrated circuit including emission logic to cause an LED emission pulse and a comparator logic to trigger the emission logic to supply a drive current to an LED during the LED emission pulse, wherein the integrated circuit is comprised of crystalline silicon and contained within a chip of an array of chips coupled with the TFT backplane; and
   a ramp signal generator to cause a voltage ramp having a slope based on an analog input voltage from the TFT backplane, wherein a length of the LED emission pulse is related to the slope of the voltage ramp and the LED emission pulse is adjustable from a continuous duty cycle to a non-continuous duty cycle.

2. The display driver hardware circuit as in claim 1, wherein the TFT backplane includes a low temperature poly-silicon (LTPS) transistor.

3. The display driver hardware circuit as in claim 2, wherein the TFT backplane additionally includes an Indium Gallium Zinc Oxide (IGZO) transistor.

4. The display driver hardware circuit of claim 1, wherein the integrated circuit has a maximum lateral dimension of 1 to 100 µm.

5. The display driver hardware circuit as in claim 1, wherein the emission logic is to supply a constant current to the LED, the constant current based on an adjustable reference voltage.

6. The display driver hardware circuit as in claim 1, wherein the emission logic is to terminate current to the LED to end the LED emission pulse based on output of the comparator logic.

7. The display driver hardware circuit as in claim 6, wherein the comparator logic includes a transistor having a voltage source coupled to a substrate terminal, the voltage source to modify a voltage threshold of the transistor.

8. The display driver hardware circuit as in claim 7, wherein the voltage source is to increase the voltage threshold of the transistor.

9. A display driver hardware circuit comprising:
   a thin film transistor (TFT) backplane; and
   an integrated circuit including emission logic to cause an LED emission pulse, the LED emission pulse adjustable from a continuous duty cycle to a non-continuous duty cycle, wherein the integrated circuit is a crystalline silicon integrated circuit including a ramp signal generator to cause a voltage ramp having a slope based on an analog input voltage from the TFT backplane, wherein a length of the LED emission pulse is related to the slope of the voltage ramp.

10. The display driver hardware circuit as in claim 9, wherein the integrated circuit additionally includes comparator logic to control the emission logic during the LED emission pulse.

11. The display driver hardware circuit as in claim 10, wherein the comparator logic includes a transistor having a voltage source coupled to a substrate terminal, the voltage source to modify a voltage threshold of the transistor.

12. The display driver hardware circuit as in claim 11, wherein the voltage source is to increase the voltage threshold of the transistor.

13. A light emitting assembly comprising:
   an array of light emitting diode (LED) devices;
   a ramp signal generator including a first thin film transistor (TFT) of a TFT backplane;
   a sample and hold circuit including a second TFT of the TFT backplane; and
   an array of microcontroller chips coupled with the TFT backplane, the array of microcontroller chips comprising an array of crystalline silicon integrated circuits to switch and drive the array of LED devices based on a voltage ramp caused by the ramp signal generator, the voltage ramp to determine a pulse length of an emission pulse to an LED device of the array of LED devices, wherein the emission pulse is adjustable from a continuous duty cycle to a non-continuous duty cycle.

14. The assembly as in claim 13, wherein a number of the microcontroller chips in the array of microcontroller chips is less than a number of LED devices in the array of LED devices, and each microcontroller chip in the array of microcontroller chips is in electrical connection with a plurality of pixels to drive a plurality of LED devices in each pixel.

15. The assembly as in claim 13, wherein each LED device in the array of LED devices has a maximum lateral dimension of 1 to 100 μm.

16. The assembly as in claim 13, wherein at least one microcontroller in the array of microcontrollers has maximum lateral dimension of 1 to 100 μm.

17. The assembly as in claim 13, further comprising a voltage compensation transistor coupled to the ramp signal generator and the sample and hold circuit, the voltage compensation transistor to cause a change in a voltage threshold of the first TFT of the ramp signal generator.

18. The assembly as in claim 13, wherein the first TFT is a low temperature poly-silicon (LTPS) transistor.

19. The assembly as in claim 13, wherein the second TFT is an Indium Gallium Zinc Oxide (IGZO) transistor.

20. A display system comprising:
a thin film transistor (TFT) backplane including an active area;
an array of micro driver chips coupled to the TFT backplane in the active area;
an array of micro light emitting diode (LED) devices in the active area, the array of micro LED devices electrically connected to the array of micro driver chips, and each micro driver chip controls a plurality of pixels, wherein the array of micro driver chips comprises an array of crystalline silicon integrated circuits to switch and drive the array of micro LED devices; and
an emission controller to cause the array of micro driver chips to supply an emission pulse to the array of LED devices, wherein a length of the emission pulse is a function of an analog input data voltage and the emission pulse is adjustable from a continuous duty cycle to a non-continuous duty cycle.

21. The display system of claim 20, additionally comprising a row of column drivers including a plurality of column drivers and a column of row drivers including a plurality of row drivers.

22. The display system as in claim 20, wherein the length of the emission pulse is inversely related to a value of the analog input data voltage.

23. The display system as in claim 20, wherein the backplane includes a low temperature poly-silicon (LTPS) transistor.

24. The display system as in claim 23, wherein the backplane includes an Indium Gallium Zinc Oxide (IGZO) transistor.

* * * * *